(12) United States Patent
Trumper et al.

(10) Patent No.: US 11,360,400 B2
(45) Date of Patent: Jun. 14, 2022

(54) TRANSPORT SYSTEM HAVING A MAGNETICALLY LEVITATED TRANSPORTATION STAGE

(71) Applicants: Massachusetts Institute of Technology, Cambridge, MA (US); ASML Netherlands BV, AH Veldhoven (NL)

(72) Inventors: David L. Trumper, Plaistow, NH (US); Lei Zhou, Cambridge, MA (US); Ruvinda Gunawardana, Easton, CT (US)

(73) Assignees: Massachusetts Institute of Technology, Cambridge, MA (US); ASML Netherlands B.V., AH Veldhoven (NL)

( * ) Notice: Subject to any disclaimer, the term of this patent is extended or adjusted under 35 U.S.C. 154(b) by 353 days.

(21) Appl. No.: 16/490,206

(22) PCT Filed: May 21, 2018

(86) PCT No.: PCT/US2018/033662
§ 371 (c)(1),
(2) Date: Aug. 30, 2019

(87) PCT Pub. No.: WO2018/213825
PCT Pub. Date: Nov. 22, 2018

(65) Prior Publication Data
US 2022/0004110 A1    Jan. 6, 2022

Related U.S. Application Data

(60) Provisional application No. 62/508,600, filed on May 19, 2017.

(51) Int. Cl.
*G03F 7/20* (2006.01)
*H02K 41/03* (2006.01)

(52) U.S. Cl.
CPC ...... *G03F 7/70758* (2013.01); *G03F 7/70741* (2013.01); *H02K 41/033* (2013.01)

(58) Field of Classification Search
CPC .................................................. G03F 7/70758
See application file for complete search history.

(56) References Cited

U.S. PATENT DOCUMENTS

| 4,577,959 A | 3/1986 | Yazaki |
| 5,051,225 A * | 9/1991 | Hommes ................. B29C 55/20 264/288.4 |

(Continued)

OTHER PUBLICATIONS

Zhou, Lei. Magnetically Levitated Hysteresis Motor Driven Linear Stage for In-Vacuum Transportation Tasks, Jun. 2019, Massachusetts Institute of Technology, Ph.D. thesis. (Year: 2019).*

(Continued)

*Primary Examiner* — Steven Whitesell Gordon
(74) *Attorney, Agent, or Firm* — Daly, Crowley, Mofford & Durkee LLP

(57) ABSTRACT

A reticle transport system having a magnetically levitated transportation stage is disclosed. Such a system may be suitable for use in vacuum environments, for example, ultra-clean vacuum environments. A magnetic levitated linear motor functions to propel the transportation stage in a linear direction along a defined axis of travel and to magnetically levitate the transportation stage.

9 Claims, 16 Drawing Sheets

(56) References Cited

U.S. PATENT DOCUMENTS

| | | | |
|---|---|---|---|
| 6,107,703 A * | 8/2000 | Korenaga | H02K 41/031 310/12.06 |
| 7,868,488 B2 | 1/2011 | Lee | |
| 2001/0019250 A1 | 9/2001 | Lee | |
| 2003/0068215 A1 | 4/2003 | Mori et al. | |
| 2004/0160132 A1 | 8/2004 | Carter et al. | |
| 2005/0133732 A1 | 6/2005 | Ohtomo et al. | |
| 2005/0168076 A1 | 8/2005 | Hazelton | |
| 2005/0174551 A1 * | 8/2005 | Phillips | G03F 7/70758 355/53 |
| 2006/0033903 A1 | 2/2006 | Yuan et al. | |
| 2008/0054838 A1 | 3/2008 | Butler et al. | |
| 2008/0129977 A1 | 6/2008 | Nishimura | |
| 2012/0099095 A1 | 4/2012 | Zhu et al. | |
| 2013/0099095 A1 | 4/2013 | Parks | |
| 2013/0249324 A1 | 9/2013 | Gandi et al. | |
| 2014/0111780 A1 | 4/2014 | Iwase et al. | |
| 2015/0175031 A1 | 6/2015 | Henderson et al. | |
| 2016/0065043 A1 | 3/2016 | Lu et al. | |
| 2017/0115580 A1 | 4/2017 | Zhu et al. | |
| 2019/0179233 A1 | 6/2019 | Butler et al. | |

OTHER PUBLICATIONS

U.S. Non-Final Office Action dated Sep. 9, 2021 for U.S. Appl. No. 17/047,879; 16 Pages.

Response to U.S. Non-Final Office Action dated Sep. 9, 2021 for U.S. Appl. No. 17/047,879; Response filed on Dec. 21, 2021; 10 Pages.

Holmes et al. "The long-range scanning stage: a novel platform for scanned-probe microscopy" Precision Engineering Journal of the International Societies for Precision Engineering and Nanotechnology, Jun. 22, 1999, 19 pages.

Jung et al. "Study on a Novel Contact-Free Planar System Using Direct Drive DC Coils and Permanent Magnets", IEEE/ASME Transactions on Mechatronics, vol. 7, No. 2, Mar. 2002, 9 pages.

Kim et al. "High-Precision Control of a Maglev Linear Actuator with Nanopositioning Capability", Proceedings of the American Control Conference Anchorage, AK May 8-10, 2002, 6 pages.

Kim et al. "High-precision magnetic levitation stage for photolithography" Precision Engineering 22:66-77, Jan. 1998, 12 pages.

Mori et al. "Linear Actuator with Air Bearing for Highly Precise Tracking" IEEE, Jan. 2002, 2 pages.

Verma et al. "Multi-Axis Maglev Nanopositioner for Precision Manufacturing and Manipulation Applications", IEEE Jan. 2004, 8 pages.

Woo et al. "Design and Optimization of Long Stroke Planar Motion Maglev Stage using Copper Strip Array" International Journal of Precision Engineering And Manufacturing vol. 16, No. 3, pp. 479-485, 7 pages.

PCT International Search Report and Written Opinion dated Aug. 24, 2018 for International Application No. PCT/US2018/033662; 17 Pages.

International Preliminary Report on Patentability dated Nov. 28, 2019 for PCT Application No. PCT/US2018/033662; 10 pages.

U.S. Appl. No. 17/047,879, filed Oct. 15, 2020, Zhou, et al.

Search Report of the ISA dated Jul. 12, 2019 for International Application No. PCT/US2019/028266; 3 Pages.

Written Opinion of the ISA dated Jul. 12, 2019 for International Application No. PCT/US2019/028266; 9 Pages.

Zhou, et al.; "Position Control for Hysteresis Motors: Transient-time and Field-oriented Control"; IEEE International Electric Machines and Drives Conference (IEMDC); May 2017; 10 Pages.

* cited by examiner

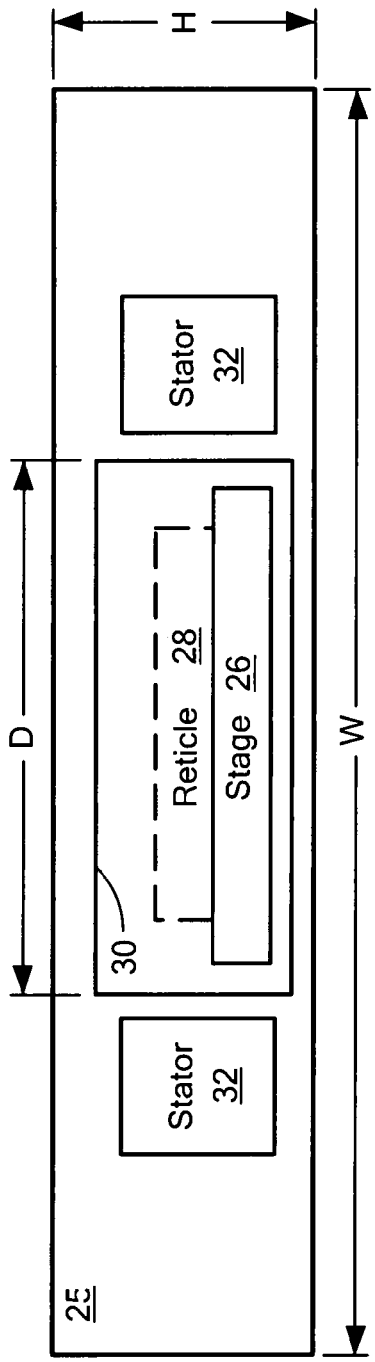
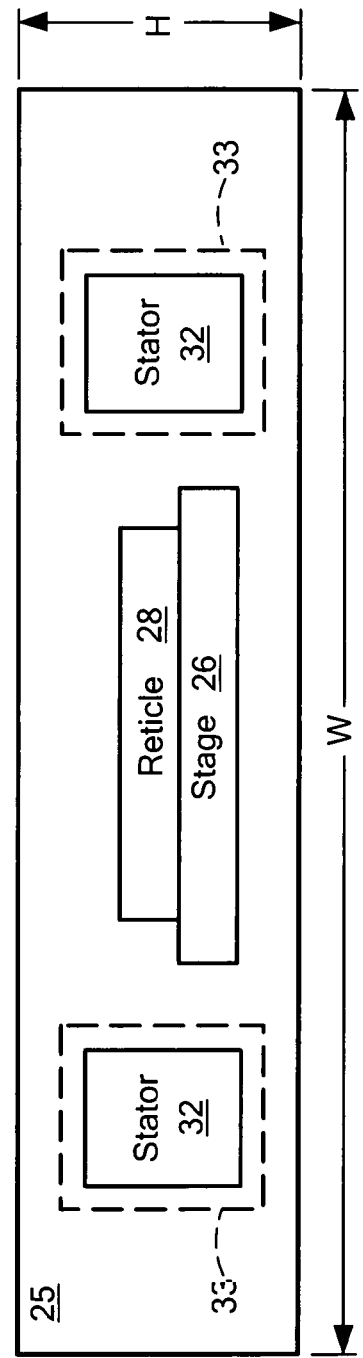
FIG. 1A
FIG. 1B

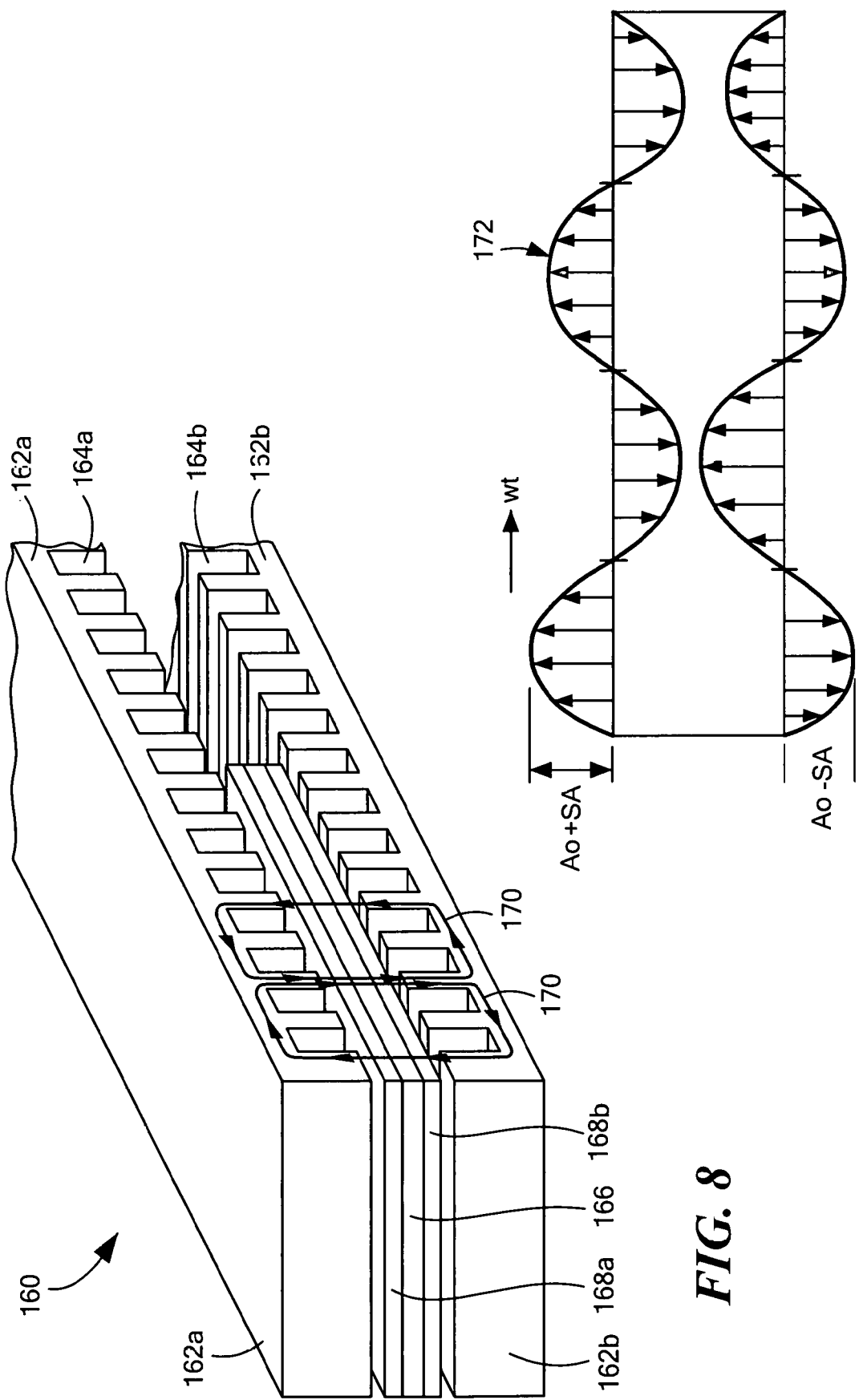

TRANSPORT SYSTEM HAVING A MAGNETICALLY LEVITATED TRANSPORTATION STAGE

CROSS-REFERENCE TO RELATED APPLICATIONS

This patent application is a U.S. National Stage of PCT application number PCT/US2018/033662 filed in the English language on May 21, 2018, and entitled "TRANSPORT SYSTEM HAVING A MAGNETICALLY LEVITATED TRANSPORTATION STAGE" which claims priority to and benefit of U.S. Provisional Application No. 62/508,600 filed on May 19, 2017, which is hereby incorporated herein by reference in its entirety.

BACKGROUND

As is known in the art, photolithography (also sometimes referred to as optical lithography or ultra-violet light lithography (UV lithography)) is a process used in microfabrication to impart a desired pattern upon parts of a thin film or the bulk of a substrate. A photolithographic process uses light to transfer a desired geometric pattern from a photomask (or more simply a "mask") to a light-sensitive chemical "photoresist" (or simply "resist") on the substrate. The photomask blocks (or "masks") or otherwise directs the light to achieve the desired geometric pattern.

As is also known, in photolithography for the production of integrated circuit devices (ICs), a photomask is often referred to as a photoreticle (or more simply a "reticle"). The reticle "masks" or otherwise directs light so as to define circuitry on the substrate of an IC.

As is further known, next generation photolithography systems (e.g. extreme ultra violet (EUV) systems), require a reticle to be transported between two or more positions (e.g. a storage position and a scanning position) in a high vacuum environment. To accomplish this, the reticle may be disposed on a transportation stage which is part of a reticle transportation mechanism (or "reticle transport mechanism"). Reticle transportation mechanisms performing such a task must satisfy ultra-tight contamination requirements. Furthermore, due to increased complexity of such next generation photolithography systems, the allowed height for reticle transport mechanisms is highly constrained. Thus, it can be seen that it is becoming increasingly more challenging for reticle transport mechanisms for photolithography systems to meet mechanical and environmental requirements of next generation photolithography systems. Furthermore, it is becoming increasingly more difficult, if not impossible, for conventional robot manipulators to meet desired mechanical and environmental requirements. It would, therefore, be desirable to provide a reticle transport system capable of meeting the needs of next generation photolithography machines.

SUMMARY

In accordance with the concepts, systems, devices, circuits and techniques disclosed herein, described is a reticle transport system having a magnetically levitated transportation stage. Such a system is suitable for use in-vacuum environments (e.g. ultra-clean vacuum environments such as those required in photolithographic systems for manufacture of integrated circuits, microelectromechanical (MEMs) circuits as well as nanocircuits and devices).

By using a linear transportation stage for reticle transportation, it is possible to perform a reticle transportation task within a highly constrained volume.

Moreover, by using magnetic suspension for a linear reticle transportation stage, a transport mechanism capable of fulfilling vacuum compatibility and contamination requirements of next generation next generation photolithography systems including, but not limited to extreme ultra violet (EUV) systems is provided.

In embodiments, one or more walls separate a dirty vacuum environment from a clean vacuum environment. The transportation stage is disposed in the clean vacuum environment and a stator is disposed in the dirty vacuum environment. There are at least two techniques to achieve this. One technique is to form a chamber of clean vacuum in which the transportation stage travels (i.e. the transportation stage travels inside a transportation stage enclosure having a clean vacuum on the inside thereof). Another technique is to encapsulate the stators in some form of enclosure so that the particles generated from the permanent magnets or coils are not getting out and thus contaminate the reticle. Thus, in this technique a so-called stator enclosure is formed around the stators to prevent particles from entering the space in which transportation stage travels.

A magnetically levitated linear stage provided in accordance with the concepts described herein are suitable for reticle transportation applications for at least two reasons. First, linear stages/motors are suitable for transportation tasks, especially for those having relatively long travel distances and small allowed height. Compared with prior art systems, (e.g. robot manipulator solutions), linear transportation stages typically require less volume and thus are able to satisfy tight dimensional constraints in a vertical direction. Second, use of magnetic levitation for a reticle transportation stage eliminates mechanical friction. The elimination of mechanical friction is desired in a reticle transportation stage for at least three reasons: a) it eliminates the need for lubrication and mechanical contact bearings, which is not allowed in ultra-clean vacuum environment; b) it reduces power dissipation; c) it avoids nonlinear Coulomb friction in mechanical bearings and thus enables better control. Thus, the use of magnetic suspension for linear stages is desired for in-vacuum operation.

A magnetic levitated linear motor functions to propel the transportation stage in a linear direction along a defined axis of travel and to magnetically levitate the transportation stage in all other DOFs.

In accordance with a further aspect of the concepts, systems, devices, circuits and techniques disclosed herein, described is a transport system which comprises a magnetically levitated linear transportation stage. Such a transport system is capable of performing an in-vacuum transportation tasks.

BRIEF DESCRIPTION OF THE DRAWINGS

The foregoing features may be more fully understood from the following description of the drawings in which:

FIG. 1A is a block diagram of a reticle transport system having a magnetically levitated transportation stage;

FIG. 1B is a block diagram of an alternate embodiment of a reticle transport system having a magnetically levitated transportation stage;

FIG. 8 is an isometric view of a portion of a motor stator;

FIG. 8A is a plot of flux distribution in an air-gap for the motor segment of FIG. 8;

DETAILED DESCRIPTION

Before proceeding with a discussion of the concepts, systems, device, circuits and techniques described herein, some introductory concepts and terminology are first provided.

As used herein the term "bearingless linear motor" refers to a motor which is capable of generating thrust forces in the motion direction as well as magnetic suspension controlling forces or torques in some or all other degrees-of-freedoms.

Furthermore, it should be appreciated that relative, directional or reference terms (e.g. such as "above," "below," "left," "right," "top," "bottom," "vertical," "horizontal," "front," "back," "rearward," "forward," etc.) are used only for illustrative purposes and to promote clarity in the description of the figures. Such terms are not intended as, and should not be construed as, limiting. Such terms may simply be used to facilitate discussion of the drawings and may be used, where applicable, to promote clarity of description when dealing with relative relationships, particularly with respect to the illustrated embodiments. Such terms are not, however, intended to imply absolute relationships, positions, and/or orientations. For example, with respect to an object, an "upper" surface can become a "lower" surface simply by turning the object over. Nevertheless, it is still the same surface and the object remains the same. Also, as used herein, "and/or" means "and" or "or", as well as "and" and "or." Moreover, all patent and non-patent literature cited herein is hereby incorporated by references in its entirety for all purposes.

Figure 1:
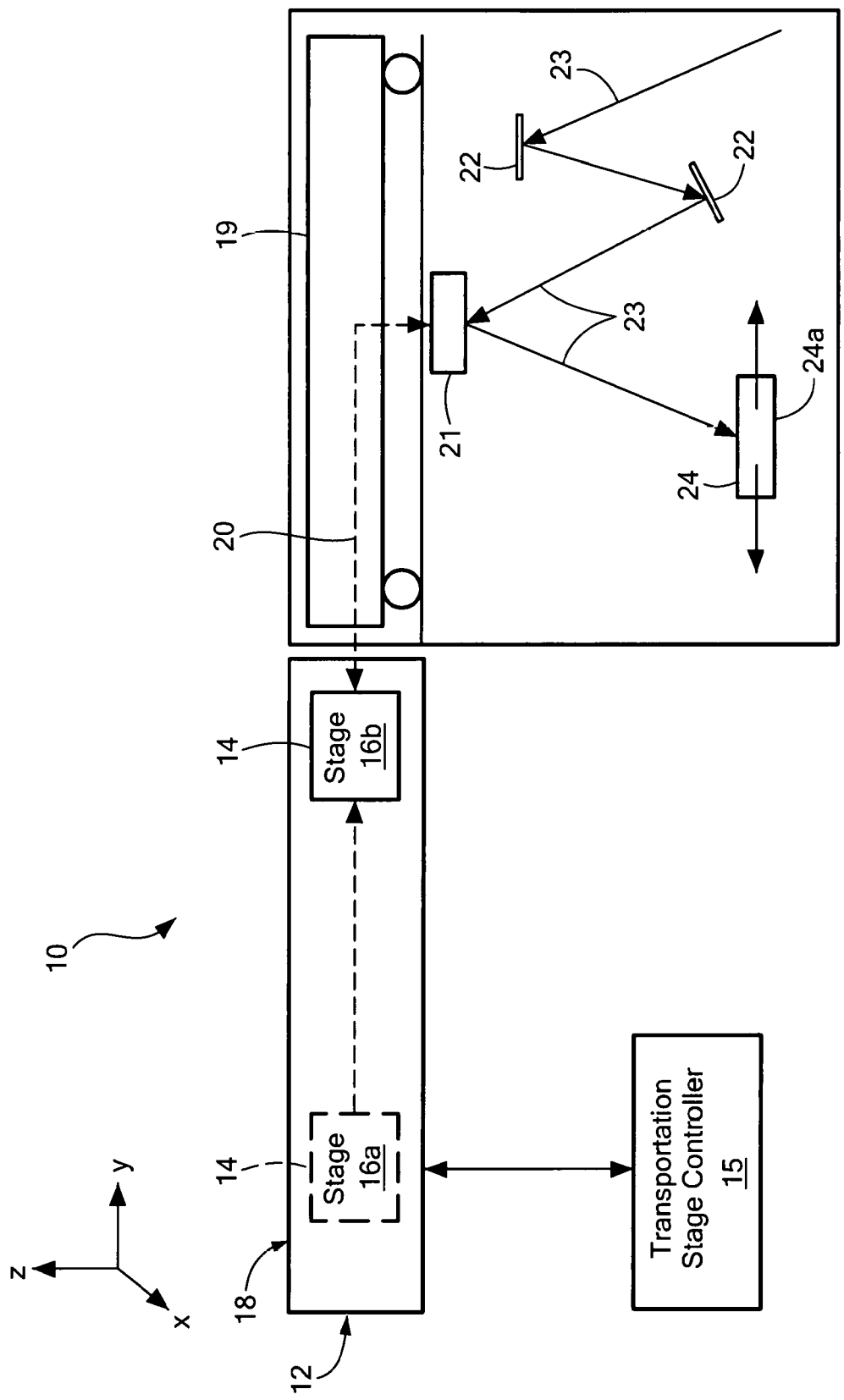
FIG. 1 is a block diagram of a photolithographic system having a reticle transport system with a magnetically levitated transportation stage.

Referring now to FIG. 1, a photolithography system 10 includes a reticle transportation system 12 includes a transportation stage drive system (not explicitly shown in FIG. 1) coupled to a magnetically levitated reticle transportation stage 14. Details of various illustrative systems, circuits, structures and techniques to implement a transportation stage drive system for magnetically levitating and moving transportation stage 14 will be described in detail herein below. Suffice it here to say that in accordance with the broad concepts described herein, a transportation stage drive system comprising a bearingless linear motor may be used to magnetically levitate and move transportation stage 14. Thus, reticle transportation system 12 operates such that in response to signals provided thereto (e.g. from a transportation stage controller 15) magnetically levitated reticle transportation stage 14 moves between at least a first position 16a and at least a second position 16b. For example, the positions 16a, 16b may correspond to storage and scanning positions, respectively and transportation stage 14 may be moved between the two positions via the transportation stage drive system.

Transportation stage 14 is disposed in an enclosure 18. It should be noted that enclosure 18 is coupled to a vacuum system (not explicitly shown in FIG. 1) capable of evacuating fluid (e.g. air) from enclosure 18. Thus, enclosure 18 corresponds to a vacuum chamber.

It should thus also be appreciated that magnetically levitated transportation stage 14 moves within a vacuum environment. Furthermore, in the case where photolithography system 10 is a next generation photolithography system (e.g. an extreme ultra violet (EUV) system) then transportation stage 14 moves in an ultra-clean high-vacuum environment.

Transportation stage controller 15 issues control signals/commands to control movement of transportation stage 14. Transportation stage controller 15 includes, for example, control circuitry and software which provides signals to initiate movement (e.g. position reference signals profiles) of transportation stage 14 between one or more positions. Transportation stage controller 15 is also capable of performing real-time control for the motion and magnetic suspensions for stage 14. That is, controller 15 is provided having an active control capability, which reads sensor signals and sends controlling commands to actuators for the transportation stage 14.

Reticle transportation system is capable of moving a reticle 21 proximate a reticle scanning stage and the reticle may be moved from the transportation stage to a reticle scanning stage via a moving means 20. The reticle is then disposed in a vacuum chamber which contains reflecting means 22 which reflect or otherwise direct a signal 23 (e.g. a light or laser signal 23) toward a substrate 24 (e.g. a wafer 24 which may be disposed on a moveable wafer stage 24a) disposed on a wafer stage 24a so as to produce a desired pattern on the substrate. It should be appreciated that all elements in photolithography system 10 have not been shown (i.e. for simplicity and to promote clarity in FIG. 1, some conventional components necessary to use light to transfer a desired geometric pattern from a photomask (or reticle) to a substrate have not been shown in FIG. 1).

Referring now to FIG. 1A, a reticle transportation channel defined by enclosure 25 having a width W and a height H has disposed therein a magnetically levitated transportation stage 26. Disposed on transportation stage 26 is a reticle 28

(here shown in phantom since reticle 28 is not properly a part of the transportation stage 26 or the transportation stage drive system).

A separating wall 30 surrounds transportation stage 26 and reticle 28 and provides a "clean vacuum environment" in which the transportation stage 26 moves. A stator 32 is also disposed in the transportation channel 25 and operates to magnetically levitate and move transportation stage 26. Significantly, transportation stage 26 is contained in a so-called clean vacuum (formed by separation wall 30) while stator 32 is separated from transportation stage 26 (and thus reticle 28) by separating wall 30. Thus, stator 32 is contained in a so-called dirty vacuum. That is, separating wall 30 defines a clean vacuum space separate from a dirty vacuum space which, in this illustrative embodiment, corresponds to the space between walls 25 and 30.

Referring now to FIG. 1B, in which like elements of FIG. 1A are provided having like reference designations, An alternative implementation of a separation wall 33 encloses the stators. In this illustrative embodiment, the space inside separation wall 33 (where the stators exist) corresponds to a dirty vacuum, while the space outside the separation wall 33 (where the transportation stage exists) corresponds to a clean vacuum. In certain embodiments, for example if the stator structure is a block while the stage is strange shaped (such as the design in FIG. 6), the wall design in FIG. 1B may be used. In other embodiments, the wall in FIG. 1A is usually easier.

Figure 1C:
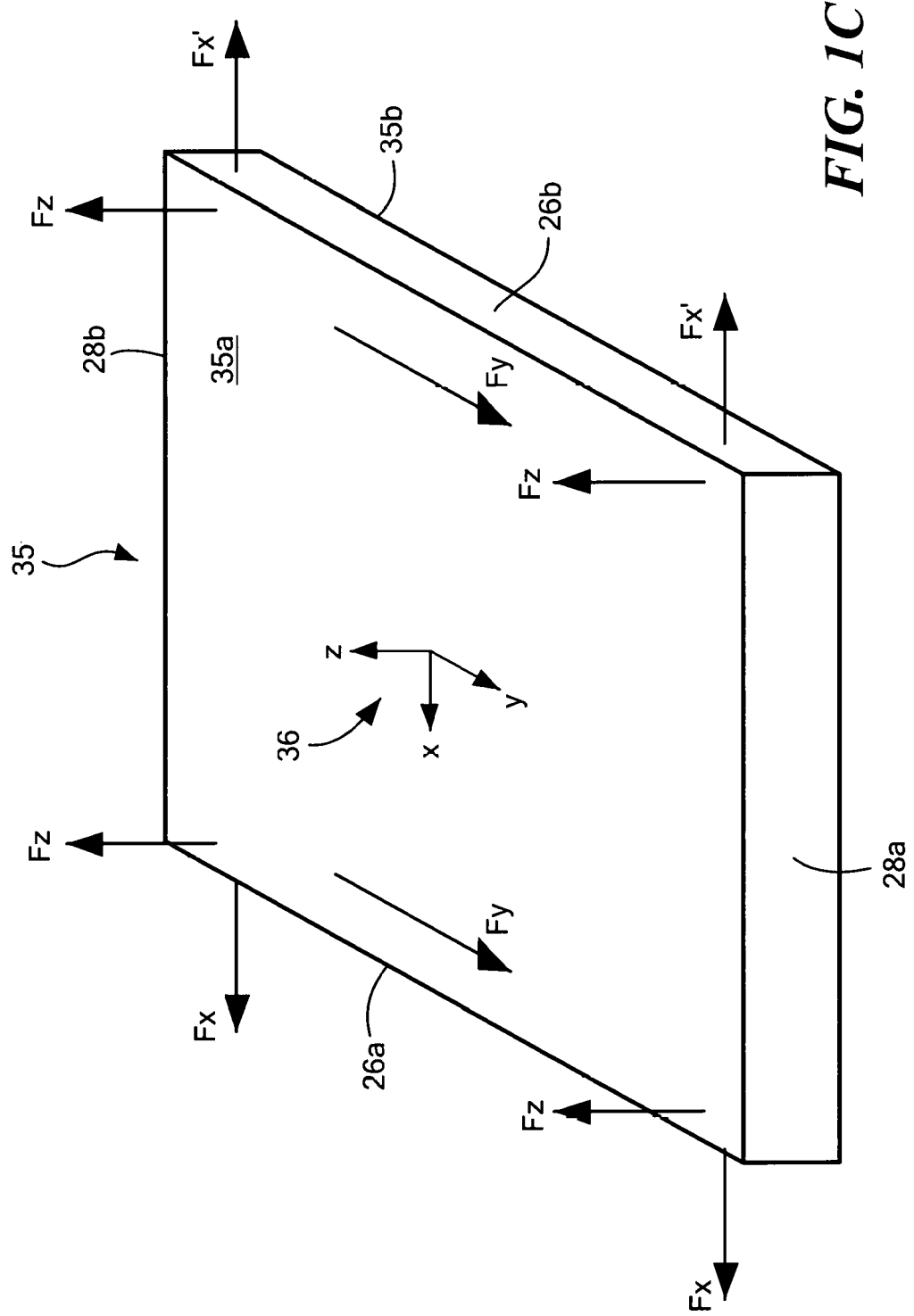
FIG. 1C is an isometric view of a free-standing magnetically levitated transportation stage.

Referring now to FIG. 1C, a magnetically levitated transportation stage 35 for reticle transportation is shown provided as a rectangular-shaped body or member having first and second opposing surfaces 35a, 35b (also sometimes referred to herein as upper and lower surfaces 35a, 35b). It should be appreciated that FIG. 1C illustrates the concept of a magnetically levitated transportation stage for reticle transport as a free body diagram (i.e. elements which levitate and move the transportation stage are not shown in FIG. 1C).

In the illustrative embodiment of FIG. 1C, stage 35 is provided having a rectangular shape. It should, of course, be appreciated that stage 35 may be provided having any shape compatible with the broad concepts described herein including, but not limited to, any of the transportation stage shapes shown and/or described in conjunction with FIGS. 1-7A.

A Cartesian coordinate system 36 defines directions used throughout this document. As may be most clearly seen in FIG. 1, the transportation stage is moving (or more properly being magnetically driven) along the y-direction (i.e. stages 15 (FIG. 1), 26 (FIGS. 1A. 1B) and 35 (FIG. 1C) move linearly in the +/−y directions) and is being magnetically levitated in all the other five (5) degrees of freedom (DOFs).

A magnetically levitated transportation stage is attractive for reticle transportation applications for at two reasons. First, linear motors are suitable for transportation tasks, particularly tasks having relatively long travel distances and small allowed height denoted as height H in FIG. 1A and represented in FIG. 1B as a vertical or Z direction according to the Cartesian coordinate system 36). Compared with robot manipulator solutions, magnetically levitated transportation stage driven by bearingless linear motors typically require less volume in the photolithography system and thus can satisfy dimensional constraints in a vertical direction with less challenge than transport systems utilizing conventional robot manipulators, for example. Second, use of magnetic levitation for a reticle transportation stage eliminates mechanical friction. In a reticle transportation stage, the elimination of mechanical friction is desired for at least three reasons: (1) elimination of mechanical friction eliminates the need for lubrication of mechanical ports, which is not allowed in vacuum environment; (2) and since there are no losses due to mechanical friction, this results in less power dissipation; and (3) elimination of mechanical friction avoids nonlinear Coulomb friction in mechanical bearings and thus enables better control (i.e. the existence of friction forces provides nonlinearity in the system's dynamics and thus add challenges to position control; accordingly, eliminating such friction forces results simplifies position control since it is not necessary to account for such friction forces).

In addition, utilizing magnetic levitation in a reticle transport system comprising a bearingless linear motor and a magnetically levitated transportation stage (e.g. stage 16, 26 or 35 in FIGS. 1, 1A, 1B) eliminates particle generation which would otherwise result due to the use of mechanical bearings.

As will be described hereinbelow, in embodiments, to reduce the complexity of a system using magnetic levitation, as will be described herein below, the transportation stage's magnetic levitation in several degrees-of-freedoms (DOFs) may be achieved passively.

The functional requirement for a magnetic levitated linear motor is to move a reticle stage linearly (i.e. in a linear direction) along an axis or direction of travel (with such an axis defined herein as a y-axis in Cartesian coordinate system 36), and to magnetically levitate the transportation stage in all other degrees of freedom (DOFs).

Before describing particular embodiments of a transport mechanism having a particular transportation stage drive system utilizing a particular type of motor, it should be appreciated that a variety of different motors may be used to drive a magnetically levitated reticle transportation stage. Several motor types are listed in Table 1 below.

It should be appreciated that Table 1 lists some, but not all, motor principle candidates and their major features, advantages, and disadvantages. Table 1 also lists comparison between different motor types. Possible advantages and disadvantages are indicated by "+" and "−" symbols within Table 1.

TABLE 1

| Motor types | Acceleration Capability | Structural simplicity | Force ripple | Efficiency | Control Simplicity | Total |
|---|---|---|---|---|---|---|
| Permanent magnet motors | ++ Good thrust generation capability | Complex multipart mover. Need encapsulation in vacuum. | − Cogging and force ripple. | ++ High efficiency. | + Linear force generation. Simple and well-established control methods exist | ++ |
| Induction motors | + Relatively good thrust generation | 0: Relative simple multi-part | −AC component in normal and | 0 Relatively good efficiency. | + Linear force generation. | + |

TABLE 1-continued

| Motor types | Acceleration Capability | Structural simplicity | Force ripple | Efficiency | Control Simplicity | Total |
|---|---|---|---|---|---|---|
| | capability. | mover structure for squirrel cage induction motor. | shear forces. | | | |
| Reluctance motors | + Relatively good thrust generation capability. | + Simple, single-part, mover with saliency. | −: Large force ripple due to mover saliency. | 0: Acceptable efficiency. | − Nonlinear thrust force generation. | 0 |
| Hysteresis motors | 0 Relatively small (while acceptable) thrust generation capability. | ++ Simple, single-part, smooth, air-gap mover structure. | + Smooth operation; small AC force component. | − Less efficient than other types. | − Nonlinear force generation. New control method required. | + |

Next follows a brief discussion of motor driving principles which may be used to provide a magnetically levitated transportation stage for reticle transportation. It should, of course, be appreciated that the selection of a particular type of motor will depend upon the specific needs of a particular application. In the design concepts/topologies shown and described below, any of the listed motor driving principle can be applied (with some different detailed stator design). However, for clarity and conciseness, only embodiments using hysteresis motors are described in detail below. After reading the disclosure provided herein, one of ordinary skill in the art will know how to build reticle transportation stages (as well as other types of transportation stages) using a wide variety of motor designs including but not limited to the motor designs identified in Table 1.

One type of motor for use in magnetically levitated stage applications is a permanent magnet (PM) motor. PM motors demonstrate good performance in terms of thrust generation, ease of control, power density, etc. The design of a magnetically levitated stage for reticle transportation utilizing a PM motor principle may be preferred in some applications but not others. Utilizing a PM motor principle may not be preferred in some applications for at least two reasons. First, PM linear motors may require a relatively complex assembly for the transportation stage. Second, when working in vacuum, permanent magnets must be encapsulated to prevent releasing gas in the vacuum, which further complicates the transportation stage design. Nevertheless, there may be some magnetically levitated transportation stage applications in which use of a PM motor is acceptable, and in some cases, even preferred.

Another type of motor for use in magnetically levitated transportation stage applications is an induction motor having a wound rotor or squirrel cage rotor. Induction motors, however, have a force ripple characteristic. When an induction linear motor is equipped with magnetic suspension, oscillations in a vertical direction (i.e. in a direction which is normal to a surface of a stage being moved and illustrated as the Z-direction in FIG. 1B) may be expected since there will be AC components in normal force due to traveling eddy currents in a moving transportation stage. However, a linear induction motor having a solid secondary can be attractive for a magnetically levitated transportation stage application.

Another type of motor for use in magnetically levitated transportation stage applications is a reluctance motor. Reluctance motors utilize a monolithic steel stage construction and also have the advantage of producing a shear force which is relatively large compared with other types of motors. However, when being used for magnetically levitated reticle transportation stages, a large normal force ripple typical of a reluctance motor may lead to z-direction vibration/oscillation of a stage. This is undesirable when the transportation stage is being used for reticle transportation since such vibration/oscillation of a reticle can be a potential source of particle generation. With proper control, however, such stage vibration/oscillation can be mitigated, which makes the reluctance motor appropriate for use in a reticle transport system.

Another type of motor for use in a magnetically levitated transportation stage applications is a hysteresis motor (HM). Hysteresis motors have the advantages of a simple structure and vibration-free operation. The motor moving parts (i.e. the portions of the stator which move along with the transportation stage) can be made out of any suitable material including, but not limited to, solid or laminated steel, having a high strength characteristic (e.g. hysteresis motors may utilize a monolithic steel stage construction as is also the case with the inductance motors). This feature of HMs allows removal of permanent magnets from the transportation stage which, as noted above, is capable of moving and thus has weight considerations and (as also noted above) may also have height and/or volume restrictions. The HMs described herein are thus more readily able to fit in an available footprint and, as will become apparent from the description provided hereinbelow, may be better suited to operate in vacuum compared with other motor types in at least some applications.

Removal of the PMs from the transportation stage also allows the transportation stage to be provided either as a single part (i.e. a monolithic part) or as an assembled part (i.e. with separate physical components joined or otherwise assembled together to form an integrated part) for structure and magnetic purposes. Transportation stages provided in either manner are preferably provided having a relatively low mass. In the case where a transportation stage is provided as a monolithic part, injection molding and/or other techniques may be used in combination with other techniques (e.g. additive or subtractive manufacturing techniques) to provide such a monolithic part. In the case where a transportation stage is provided as an integrated part (i.e. from separate physical components joined or otherwise assembled together to form the transportation stage), parts may be removably joined (e.g. using some form or fastener) or permanently joined (e.g. via a welding or other permanent joining technique).

In addition, reluctance force between the stator and the moving steel (i.e. the HM secondary and the bearing secondary) can be used for the magnetic suspension, which provides a relatively simple solution for the magnetic bearing design. Thus, the above-noted advantages make hysteresis motors suitable for use in reticle transportation applications.

From Table 1, it can be seen that the total rating of different motor concepts show that the permanent magnet motor is still the most direct solution to reticle transport. The main difference between the motor types is the material from which the secondary is fabricated and the details of the motor construction while the stators of the transportation stage and the magnetic suspension design can be similar. Thus, the magnetically levitated transportation stage described herein can work with induction, reluctance and hysteresis motors. These motors all share a similar stator structure and magnetic design, but have different secondary materials and configurations.

It should thus be appreciated that while some embodiments described herein utilize a magnetically suspended transportation stage driven by a hysteresis motor, all embodiments described herein are operable with reluctance, induction and hysteresis motors, which are vacuum compatible.

Figure 2:
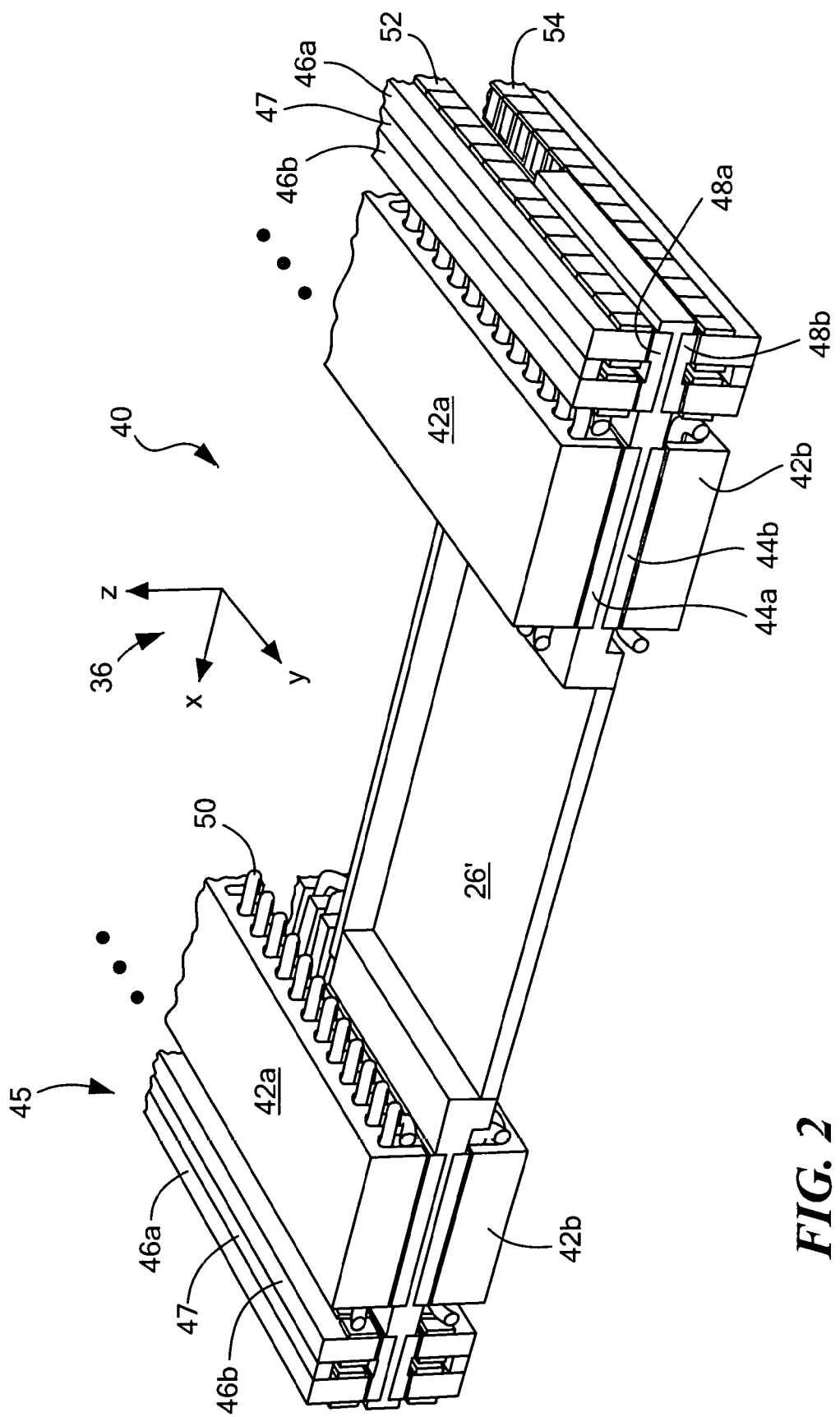
FIG. 2 is an isometric view of a reticle transport system having an embodiment of a magnetically levitated transportation stage.
Figure 2A:
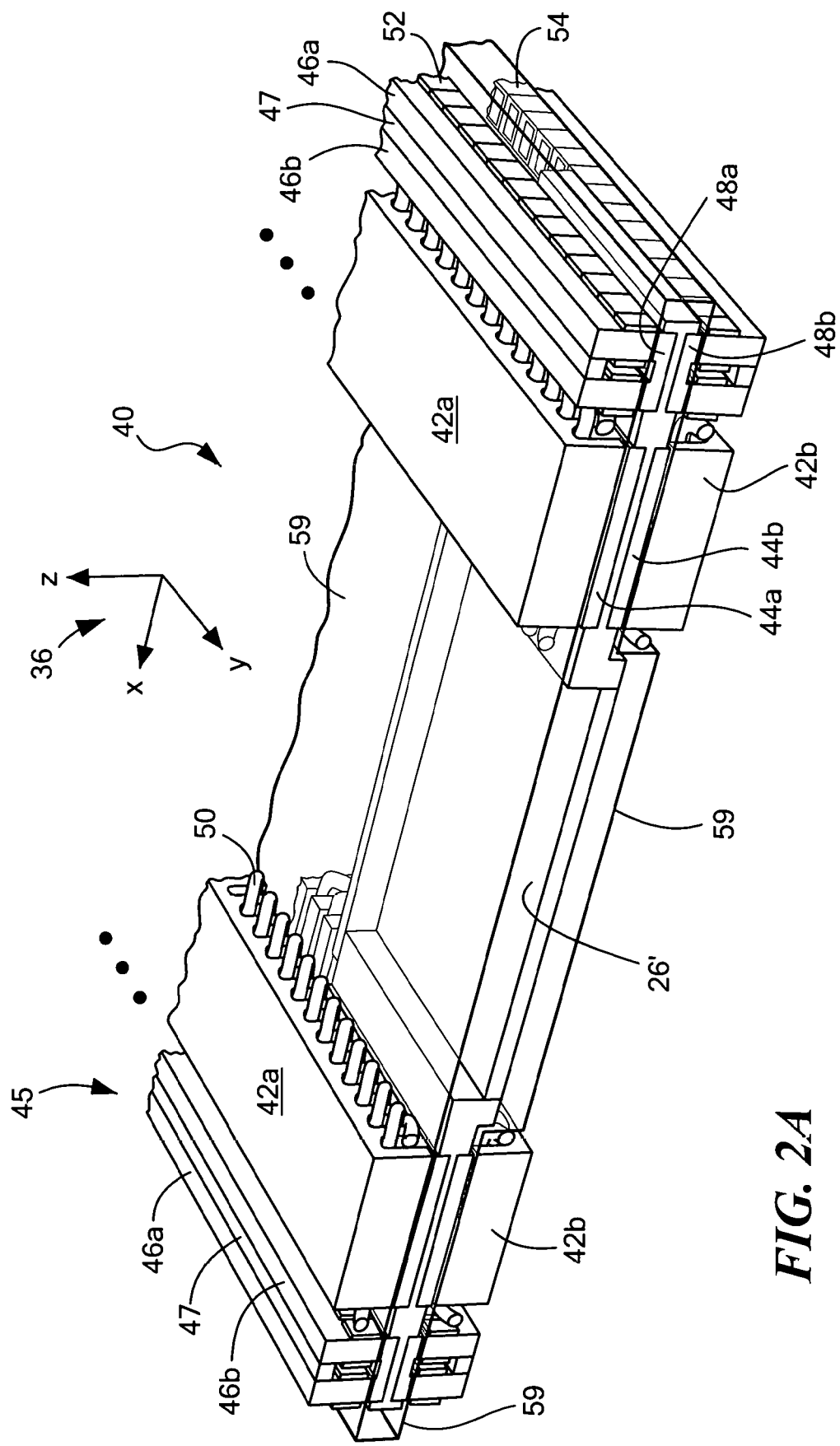
FIG. 2A is an isometric view of a reticle transport system having an embodiment of a magnetically levitated transportation stage and a separation wall between dirty and clean vacuum spaces.
Figure 2B:
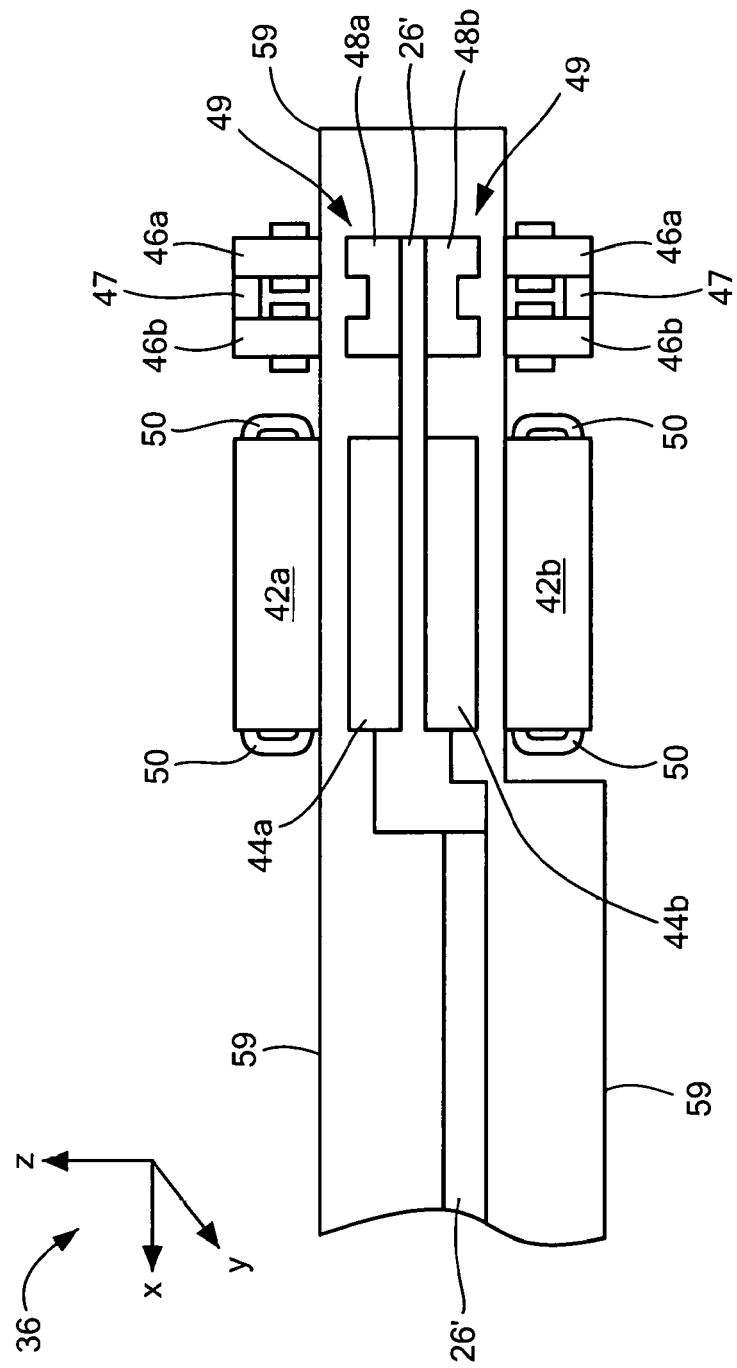
FIG. 2B is a cross-sectional view the reticle transport system of FIG. 2 illustrating a separation wall.

Referring now to FIGS. 2-2B in which like elements are provided having like reference designations throughout the several views, a transport system includes a magnetically levitated transportation stage driven by a hysteresis motor. The transportation stage is traveling along y-axis (as defined by coordinate system 36) and is magnetically levitated in all other degrees-of-freedom. As will be described, the magnetic suspension in x-direction and $\theta_z$ (the rotation about z-axis) are achieved passively, and the magnetic suspension in other directions are actively controlled.

The hysteresis motor includes two kinds of stator segments 42a, 42b, 44a, 44b with first ones of the segments 42a, 42b corresponding to a thrust generation stator 42 and a second one of the segments corresponding to a hysteresis motor secondary 44a, 44b. In this illustrative embodiment, hysteresis motor secondary 44a, 44b is coupled to opposing surfaces of the transportation stage. A PM-biased magnetic bearing 45 (which may also be referred to as a "PM-biased $\theta_x$ suspension system" or more simply as a "bias magnetic bearing") comprises stator segments 46a, 46b and a permanent magnet 47 disposed about a bearing secondary 48a, 48b. In this illustrative embodiment, bearing secondary 48a, 48b is coupled to opposing surfaces of the transportation stage (i.e. the transportation stage is here illustrated as an integrated assembly including at least two components—i.e. a transportation stage base portion (i.e. the portion of the transportation stage on which a reticle may be disposed) as well transportation stage conveyor portions (i.e. the portions of the transportation stage on which bearing secondaries 48a, 48b and motor secondaries may be disposed).

As noted above, in the illustrative embodiment of FIGS. 2-2B, the hysteresis motor secondary is disposed on and coupled to surfaces of the transportation stage. Similarly, the bearing secondary is disposed on and coupled to surfaces of the transportation stage. It should be appreciated, however, that in some embodiments the hysteresis motor secondary 44 and bearing secondary 48 may be provided as an integral portion of the transportation stage (i.e. the transportation stage 26' hysteresis motor secondary 44 and bearing secondary 48 may be provided as a monolithic structure).

Stator segments 42a, 42b correspond to thrust generation stators and four set of three-phase windings 50 are arranged in slots of each stator. It should be appreciated that the windings of each stator segment needs to be separated. That is, the currents in the coil on one stator segment is not connected in series or parallel with the coils on another stator segment. This arrangement allows the stators to generate different normal directional forces. These stators can generate controlled shear and normal forces. Here, the shear force is used to drive the motion of the stage 26 and control its position in y-direction, and the normal forces are used to control the magnetic suspension of the stage 26 in z- and $\theta_y$-directions, according to the coordinate system 36). Stator segments 46a, 46b, 47 are $\theta_x$ suspension stators with permanent magnet bias flux, in which permanent magnet 47 is provided having its magnetization vector in the cross-motion direction in the plane (i.e. a plane corresponding to a horizontal plane as defined by the x and y axes of coordinate system 36 such that the magnetization vector is directed in either the positive or negative x-direction according to coordinate system 36). Permanent magnet 47 provides DC bias magnetic flux in air-gap 49 (FIG. 2B), which provides passive magnetic suspension stiffness in the x-direction and $\theta_z$-direction. In addition to the bias magnetic flux, the field generated by the windings 52, 54 in the $\theta_x$ suspension bearing segments steers the bias DC magnetic flux to generate the suspension moment in the $\theta_x$ direction.

Referring now to FIGS. 2A and 2B, in which like elements of FIG. 2 are provided having like reference designations, the transportation system further includes a separation wall 59 which maintains a clean vacuum environment around the transportation stage 26'. Significantly, the stator segments 42a, 42b and stator segments 46a, 46b, and permanent magnet 47 are external to the space defined by the separation wall 59.

Next described are several alternative designs for transportation stages. Such vacuum stages are suitable for use in a vacuum environment, but still are operable outside of a vacuum environment.

Figure 3:
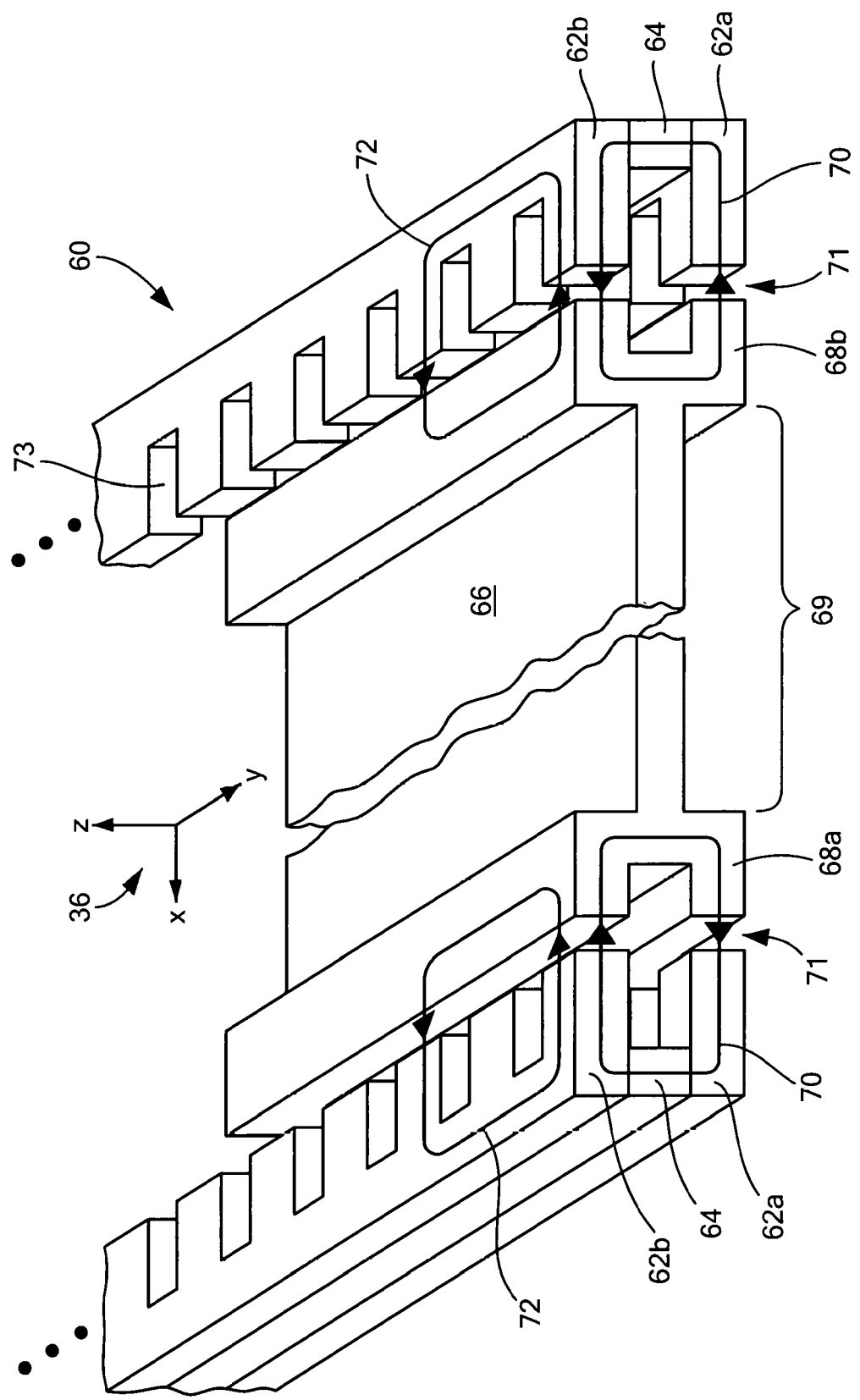
FIG. 3 is an isometric view of a portion of another embodiment of a transport system having a magnetically levitated transportation stage.
Figure 3A:
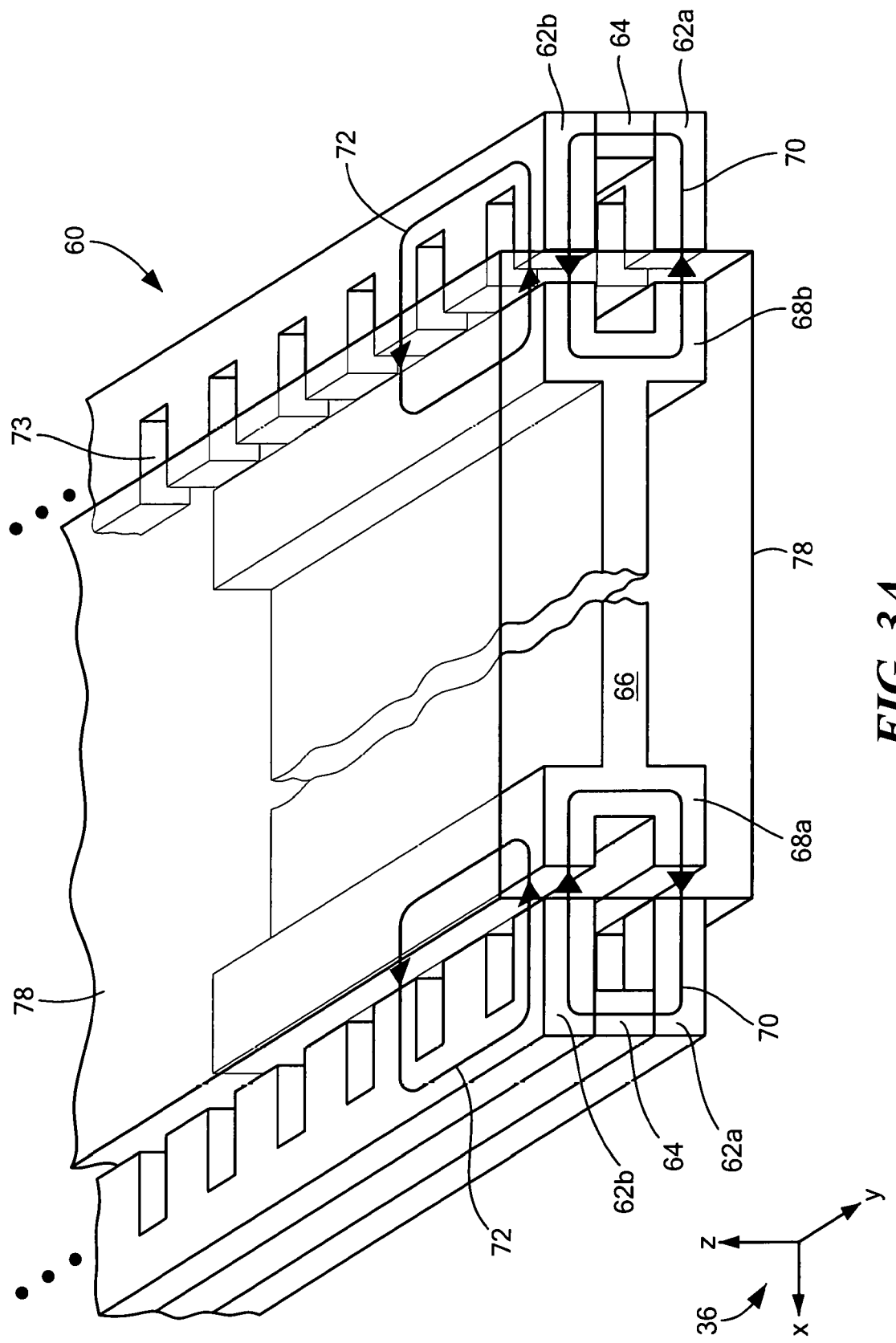
FIG. 3A is an isometric view of the transport system of FIG. 4 including a separation wall.

Referring now to FIGS. 3 and 3A in which like elements are provided having like reference designations, shown is a transportation system 60 which comprises a pair of linear slice motors arranged on both sides of a transportation stage 66. The transportation stage 66 in the center is traveling along the y-direction (as defined by the coordinate system 36 in FIGS. 1-2B), and is magnetically levitated in all other degrees of freedom. The magnetic levitation in z, $\theta_x$ and $\theta_y$, directions are achieved passively, and the magnetic suspension in x- and $\theta_z$ directions are actively controlled. Each linear slice motor comprises a primary (here stator segments 62a, 62b and a secondary (which is on the transportation stage). A permanent magnet 64 is disposed between the stator segments, and the one motor secondary 68 on the transportation stage.

An air gaps 71 exists between stator segments 62a, 62b and secondaries 68a, 68b. There are two types of magnetic flux in the air gaps. The magnetic flux designated 70 is the DC bias magnetic flux generated by permanent magnet 64, which is used to maintain the passive magnetic suspension direction. The magnetic flux designated 72 is generated by the windings (which are omitted from the figure for clarity) configured in the slots 73. The windings in the slots are controlled separately, and therefore they can generate a traveling magnetic wave for generate thrust force along y-direction, normal forces for control x-direction magnetic suspension, and torques to control $\theta_z$ direction magnetic suspension.

This configuration allows three degrees-of-freedom magnetic suspension to be passive, which greatly reduces the system complexity since many sensors and actuators can be saved.

It should be noted that permanent magnet 64 is provided having a vertically oriented magnetic field vector (i.e. oriented in the Z-direction as defined by coordinate system 36 of FIGS. 1-2B).

It should be appreciated that transportation stage 66 can be provided from any magnetically responsive material. That is, in the case where the transportation stage 66 is provided as a monolithic component the entire stage may be made out of a hysteresis material. In alternate embodiments, however, it would be possible to attach the motor secondary designated 68a, 68b to the base portion 69 of the stage 66 in which case the base portion 69 of the stage 66 may be made from any material and only the motor secondaries 68a and 68b may be made out of the hysteresis material.

Referring now to FIG. 3A, the transportation system further includes a separation wall 78 which maintains a clean vacuum environment around the transportation stage 66. Significantly, the stator segments 62a, 62b and permanent magnets 47 are external to the space defined by the separation wall 78.

Figure 4:
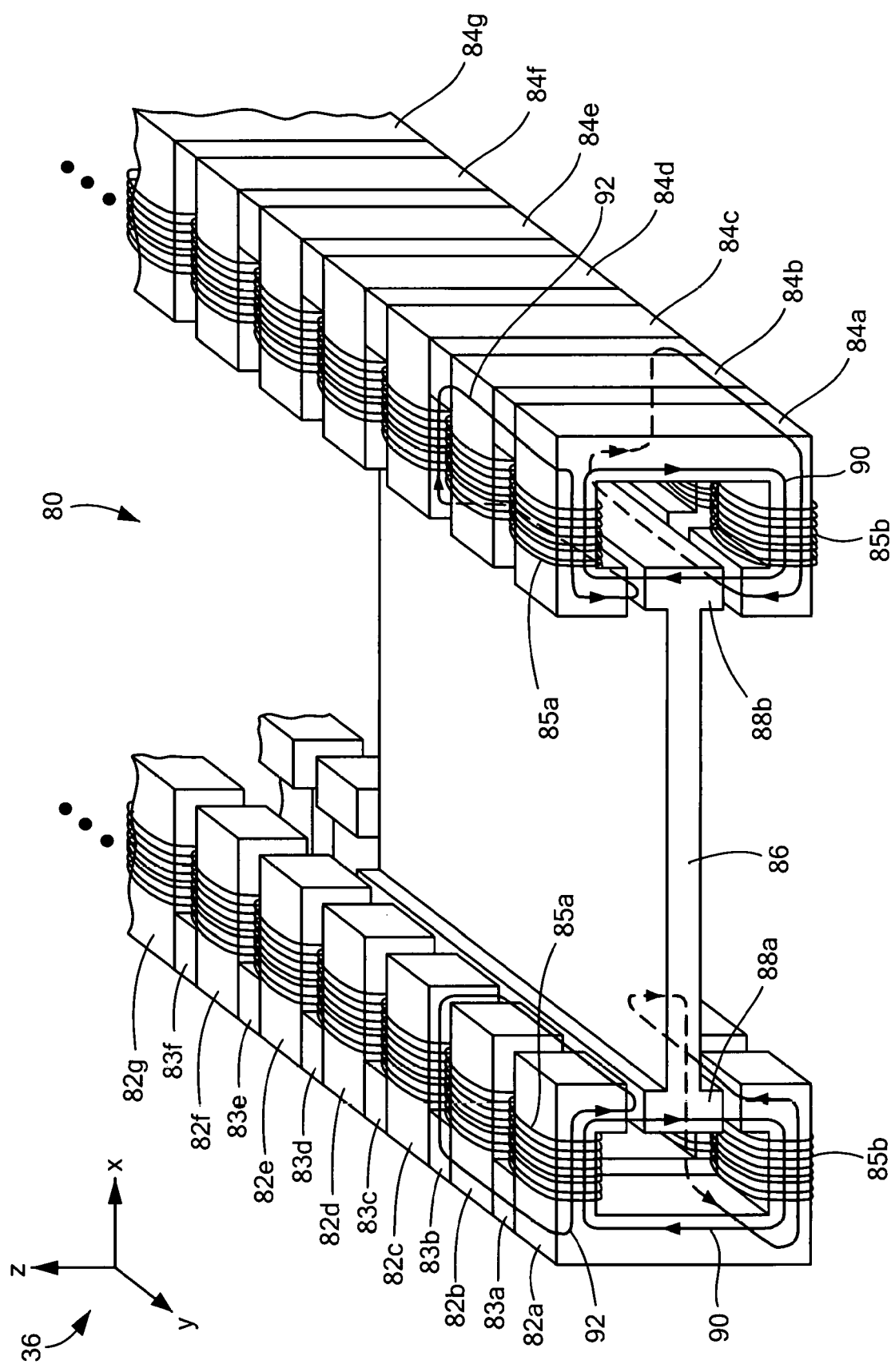
FIG. 4 is an isometric view of another embodiment of a transport system having a magnetically levitated transportation stage.
Figure 4A:
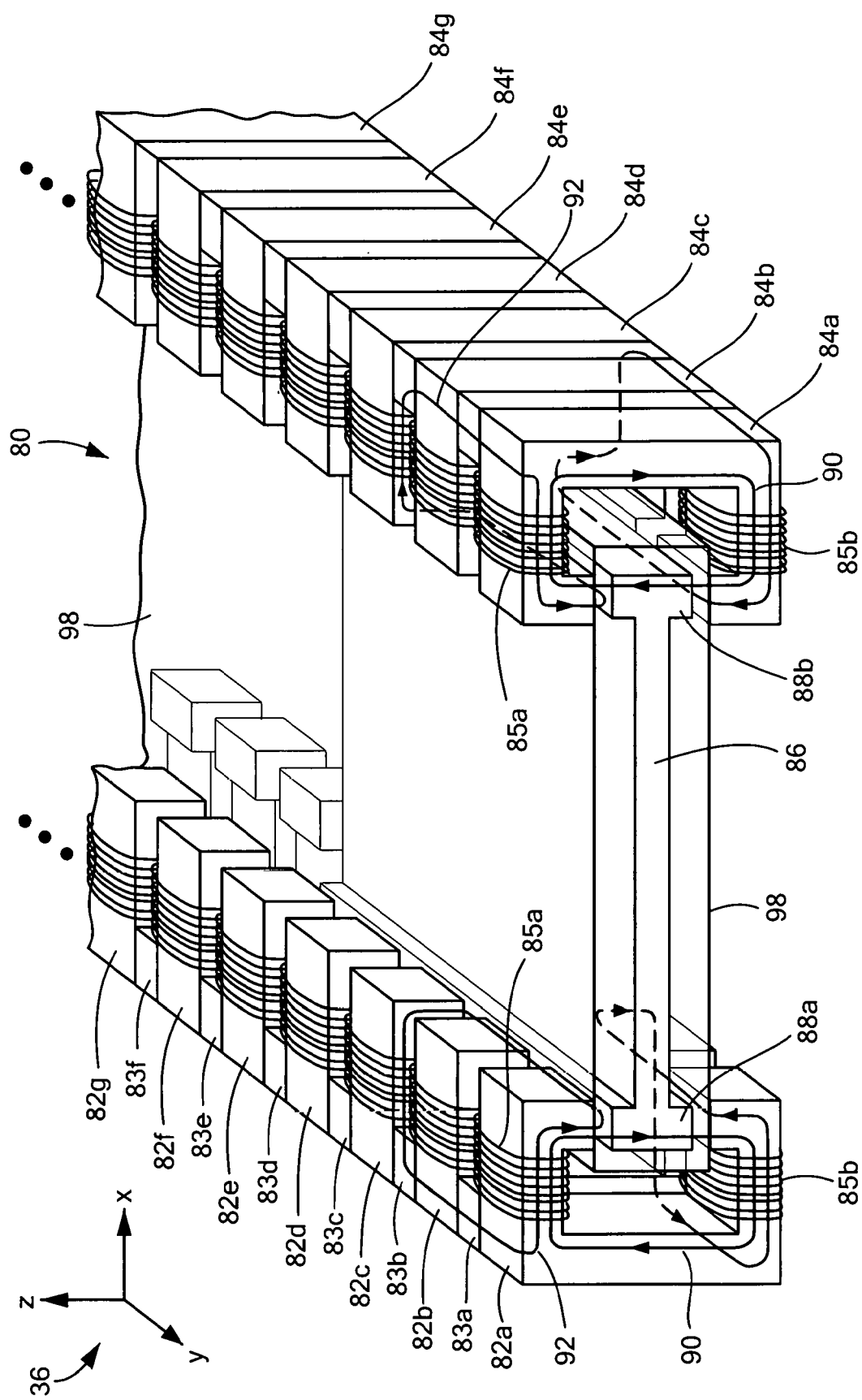
FIG. 4A is an isometric view of the transport system of FIG. 4 including a separation wall.

Referring now to FIGS. 4 and 4A, in which like elements are provided having like reference designations, a transportation system includes a transportation stage configured to interface with C-shaped cores 82a-82N as the stator. The C-shaped cores are magnetically and physically coupled via connecting blocks 83. Alternatively, in some embodiments, the C-shaped cores and connector blocks 83 may be provided monolithically.

The stator is configured as a series of C-shape cores with lumped windings 85, and the cores 82 are connected by the connector blocks 83. All stator core segments are made of laminated electric steel. There are two coils (top coil 85a and bottom coil 85b) wound on each C-shape core 82. Each coil has its current being controlled independently.

In the design of magnetically levitated linear stage, the combination of thrust generation function and magnetic suspension function is desired to reach a compact design. As is shown in FIG. 4, the common-mode current in top and bottom coil, generate an alternating motor flux. This motor flux is designated 92 in FIG. 4. The motor fluxes are traveling along the y-direction for thrust force generation. On top of the motor flux, the differential part between the currents in top and bottom generates a suspension control flux, designated as 90 in FIG. 4. Magnetic suspension control forces can be generated by the superposition of the two magnetic fluxes. This flux steers the motor flux 92 to generate magnetic suspension forces in the vertical directions, and thus actively control the stage's magnetic suspension in z and $\theta_x$, $\theta_y$ directions.

In this configuration, the moving part 88a, 88b is being magnetically suspended in the z and $\theta_x$, $\theta_y$ direction actively by a linear bearingless motor configuration of the stators.

Referring now to FIG. 4A, the transportation system 80 further includes a separation wall 98 which maintains a clean vacuum environment around the transportation stage 86. Significantly, the stator segments 82, 83, 84 are external to the space defined by the separation wall 98.

Figure 5:
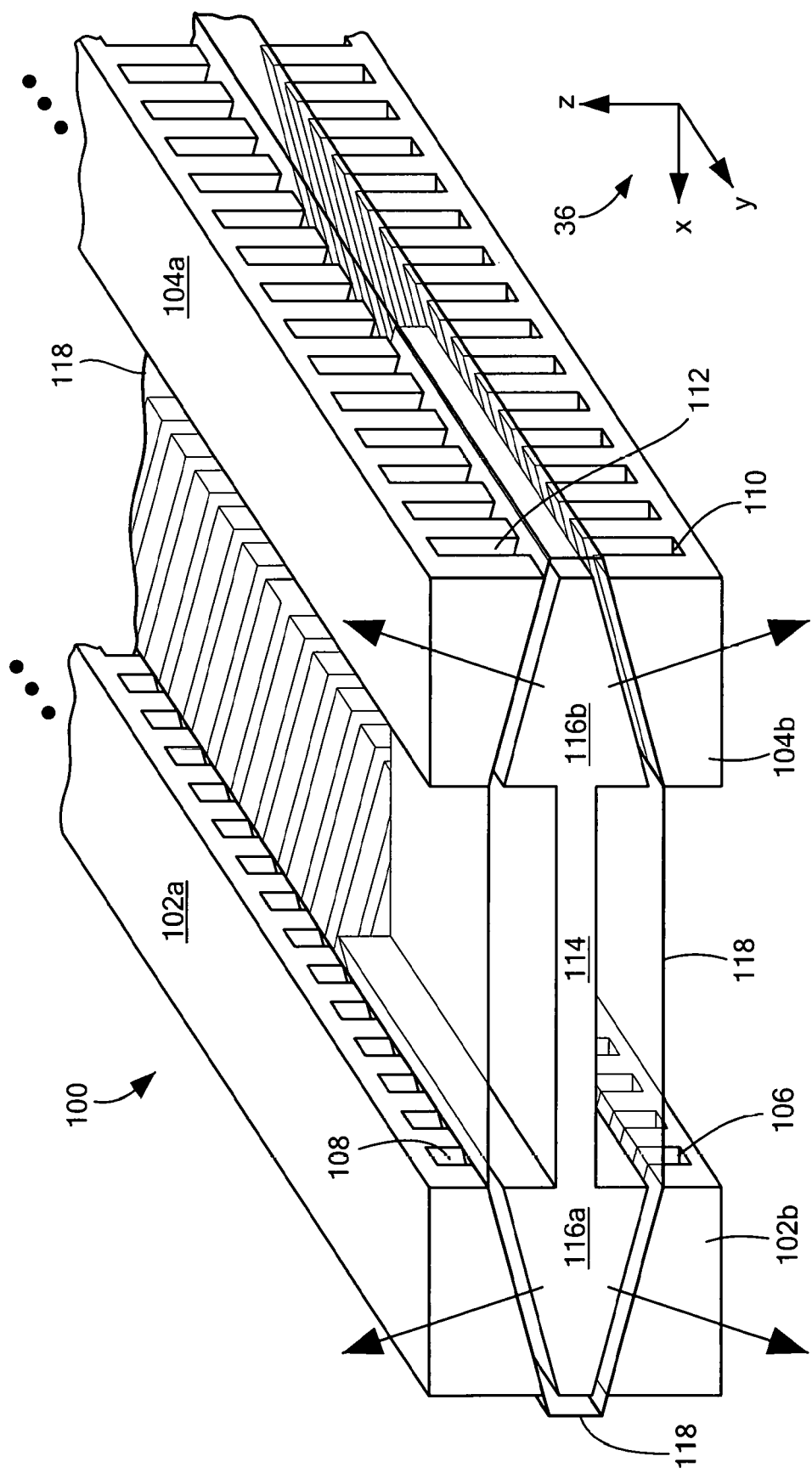
FIG. 5 is an isometric view of a portion of another embodiment of a transport system having a of magnetically levitated transportation stage.

Referring now to FIG. 5, a transportation system 100 includes four stator segments 102a, 102b, 104a, 104b arranged at an angle to the transportation stage 114. With each stator segment being able to generate an independent normal and thrust force, and can generate an independent torque about x-axis, all degrees-of-freedom magnetic suspension of the stage can be controlled actively in this configuration.

The transportation system 100 further includes a separation wall 118 which maintains a clean vacuum environment around the transportation stage 114. Significantly, the stator segments 102a, 102b, 104a, 104b are external to the space defined by the separation wall 118.

It should be appreciated that in this design all magnetic suspension forces are actively controlled. This is in contrast to the design of FIG. 4, for example, in which the magnetic suspension forces are actively controlled only in the vertical direction and are passively controlled in the horizontal direction. It should also be appreciated that the angle of the secondary has no special requirement. Any angle required to suit the needs of a particular application may be used. It should be appreciated, however, that when the secondary is not perfectly horizontal or vertical active control will be needed.

Figure 6:
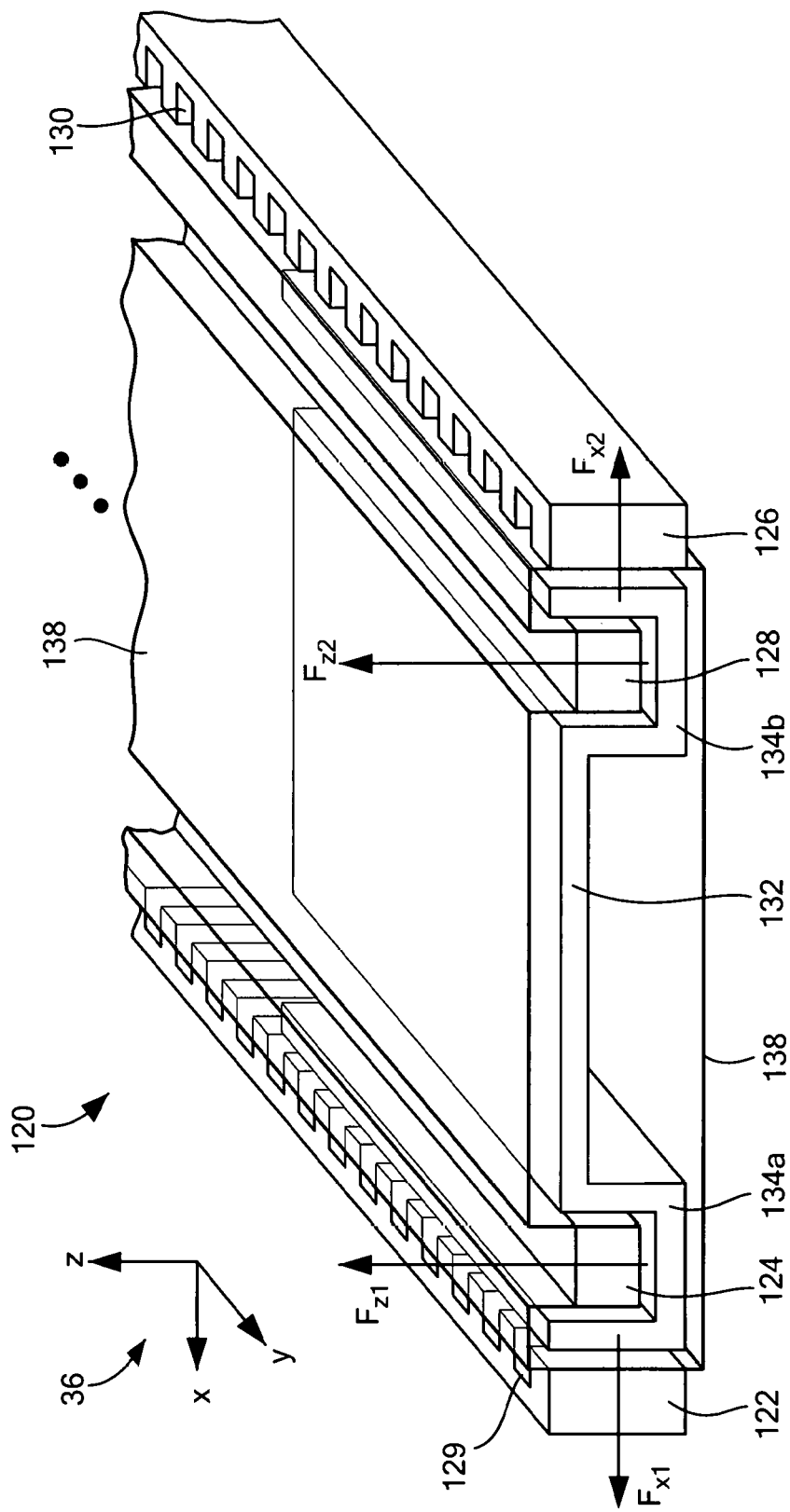
FIG. 6 is an isometric view of a portion of another embodiment of a transport system having a magnetically levitated transportation stage.

Referring now to FIG. 6, a transportation system 120 includes a stage configuration 132 with a stage having four stator segments 122, 124, 126, 128 arranged on single side of the mover. Windings 129, 130 are disposed in slots of stator segments 122, 126. Each of the stator segments 122, 124, 126, 128 can generate a thrust force, a normal force, and a torque about the x-axis. All DOF magnetic suspension are actively achieved.

The transportation system 120 may further include a separation wall 138 which maintains a clean vacuum environment around the transportation stage 132. Significantly, the stator segments 122, 124, 126, 128 are external to the space defined by the separation wall 138.

Figure 7:
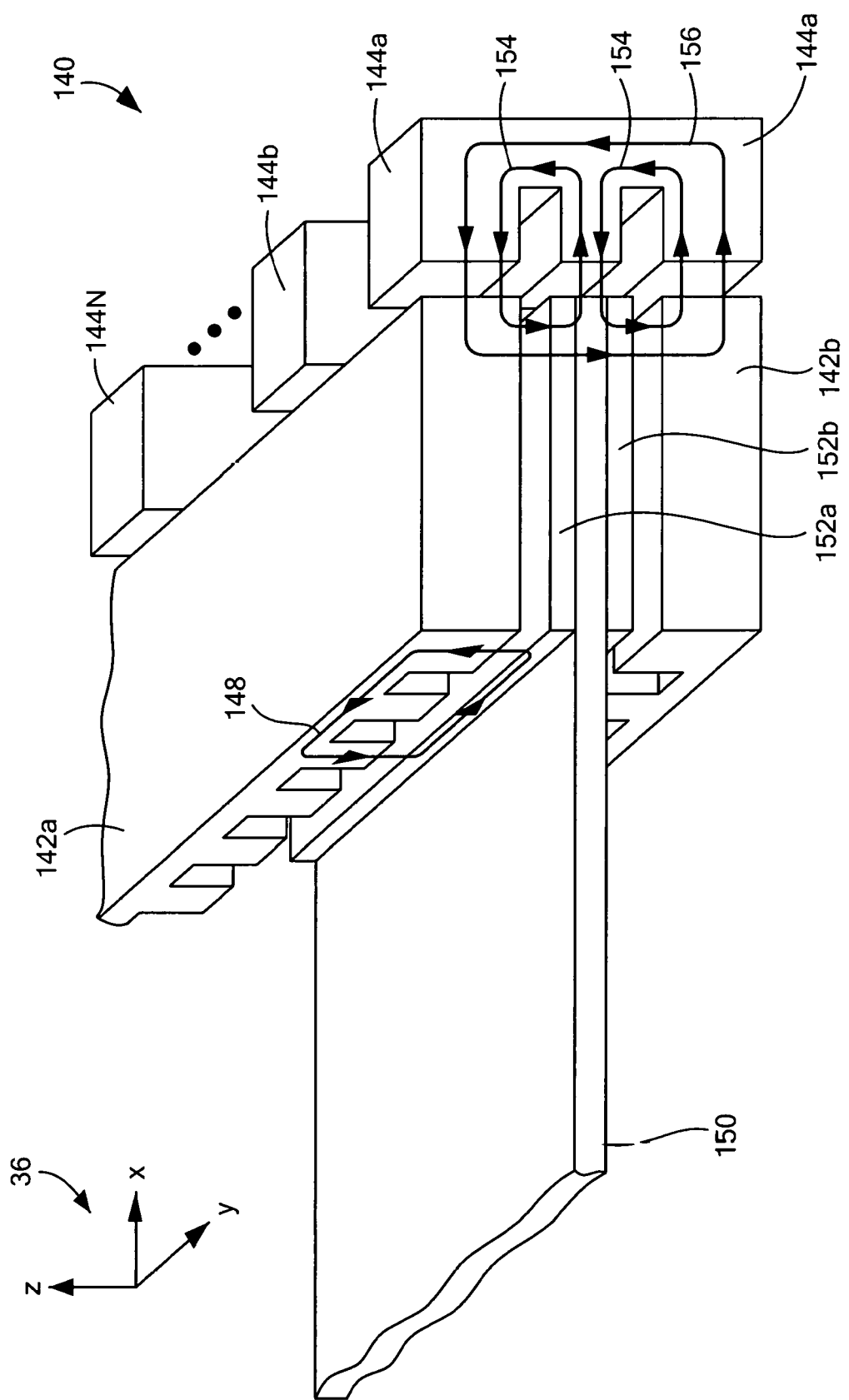
FIG. 7 is an isometric view of a portion of another embodiment of a transport system having a magnetically levitated linear stage.
Figure 7A:
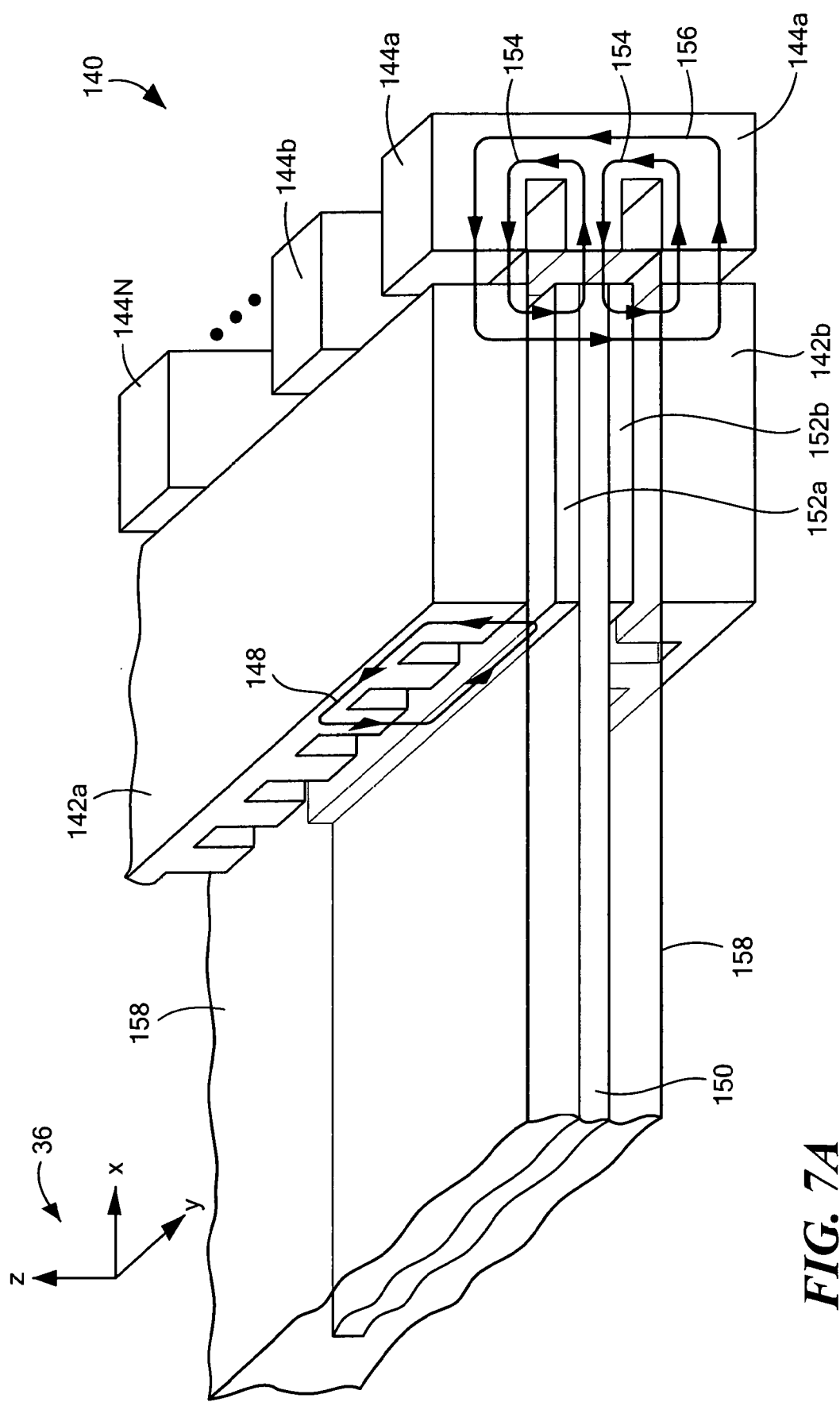
FIG. 7A is an isometric view of the transport system of FIG. 7 including a separation wall.

Referring now to FIGS. 7 and 7A, in which like elements are provided having like reference designations, a transportation system 140 includes E-shape magnetic bearings configured on the side. Four stator segments (with only two segments 152a, 152b visible in FIG. 7) are configured on opposing surfaces of the transportation stage 150, which generates thrust forces to the transportation stage. A series of magnetic bearings with E-shape cores are configured on the sides of the stators and stages. Two magnetic flux, which are labeled as 154, 156 in FIG. 7, are generated by the magnetic bearings. Flux 154 can be used to control the horizontal directional magnetic suspensions force to the stage, and flux 156 steers the motor flux. Flux 154 can also generate the vertical directional forces to the stage. The two magnetic flux 154, 156 in each of the magnetic bearing are controlled independently, and thus the suspension torque about x and z-direction can be controlled. In this design, all DOF magnetic suspension are actively controlled.

Referring now to FIG. 7A, the transportation system 140 further includes a separation wall 158 which maintains a clean vacuum environment around the transportation stage 150. Significantly, the E-shape magnetic bearings 144 are external to the space defined by the separation wall 158.

Next described is an analysis of forces and torque generation for the motor design in FIG. 2. This explains the working principle of the designs in more detail. The magnetic fluxes in the air-gaps are derived, and the reluctance force generation to the stage are calculated. These normal forces are used to actively magnetic suspend the stage.

Referring now to FIGS. 8 and 8A, the generation of the forces and torques for the thrust generation motor segments are calculated and FIG. 8A shows the magnetic field pattern in the air-gaps for the motor segment.

Assume the stage is being regulated at the center of the stators, and air-gap length is constant. The magnetic fluxes in the motor air-gaps are:

$$B_{m1}(y) = \frac{N_m(I_m + i_{m1})\cos\left(\frac{2p\pi}{L}y - \omega t\right)}{g}$$

-continued $$B_{m2}(y) = \frac{N_m(I_m + i_{m2})\cos\left(\frac{2p\pi}{L}y - \omega t\right)}{g},$$

$$B_{m3}(y) = \frac{N_m(I_m + i_{m3})\cos\left(\frac{2p\pi}{L}y - \omega t\right)}{g},$$

$$B_{m4}(y) = \frac{N_m(I_m + i_{m4})\cos\left(\frac{2p\pi}{L}y - \omega t\right)}{g},$$

where $N_m$ is the number of turns per phase for the motor winding, $I_m$ is the thrust generation current amplitude, $i_{m1}$ to $i_{m4}$ are the normal force control current amplitude, L is the length of the transportation stage, p is the number of pole-pairs over the stage length, y is the moving directional position in the stage-fixed coordinate, ω is the electrical frequency of the thrust generation flux, and g is the air-gap length.

The formal force generation of the motor segment to the transportation stage can be calculated by $$f_m = \int_A \frac{B^2}{2\mu_0} dA,$$

where $\mu_0$ is the magnetic permeability of vacuum, and A is the area of magnetic force generation. By this method, the force generation in the motor segment air-gaps are:

$$f_{m1} = \int_{-L/2}^{L/2} \frac{w_m}{2\mu_0 g^2} N_m^2 (I_m + i_{m1})^2 \cos^2\left(\frac{2p\pi}{L}y - \omega t\right) dy$$

$$= \frac{w_m L}{8\mu_0 g^2}\left(\frac{\sin(2p\pi)\cos(2p\pi)}{p\pi} + 2\right)(I_m + i_{m_1})^2,$$

where $w_m$ is the width of the motor. By selecting p=2, the expression of the normal directional magnetic force in air-gap 1 can be reduced to $$f_{m1} = \frac{w_m L}{4\mu_0 g^2} N_m^2 (I_m + i_{m1})^2$$

Assume $i_{mj} \ll I_m, j=1, \ldots, 4$. The forces in all motor air-gaps can be approximated as $$f_{m1} \approx \frac{w_m L}{4\mu_0 g^2} N_m^2 I_m^2 + \frac{w_m L}{4\mu_0 g^2} N_m^2 2 I_m i_{m1}$$

$$f_{m2} \approx \frac{w_m L}{4\mu_0 g^2} N_m^2 I_m^2 + \frac{w_m L}{4\mu_0 g^2} N_m^2 2 I_m i_{m2},$$

$$f_{m3} \approx \frac{w_m L}{4\mu_0 g^2} N_m^2 I_m^2 + \frac{w_m L}{4\mu_0 g^2} N_m^2 2 I_m i_{m3},$$

$$f_{m4} \approx \frac{w_m L}{4\mu_0 g^2} N_m^2 I_m^2 + \frac{w_m L}{4\mu_0 g^2} N_m^2 2 I_m i_{m4}.$$

In Eq. (1)-(4), the first term is the normal force generated by the thrust generation flux, and the second term is the force generated by the control flux steering the motor flux. Since the stators are configured on both the top and bottom side of the transportation stage, the first term are canceled out. The second term can control the normal force generated to the mover and therefore control the forces and torques via $$\Sigma f_z = f_1^m + f_3^m - f_2^m - f_4^m,$$

$$\Sigma T_y = W_m(f_2^m + f_3^m - f_1^m - f_4^m),$$

where $W_m$ is the width of the transportation stage.
The x-directional torque generation from the motor fluxes can be calculated by $$T_{x1} = \frac{W_m \int_{-L/2}^{L/2} B_1^{m2}}{2\mu_0} y\, dy$$

$$= \frac{W_m}{2\mu_0} \int_{-L/2}^{L/2} \frac{N_m^2(I_m + i_1^m)^2 \cos\left(\frac{2p\pi}{L} - \omega t\right)}{g^2} y\, dy.$$

With selecting p=2, the expression of the torque generated by the stator segments are $$T_{x1} = -\frac{W_m}{2\mu_0} \frac{N_m^2(I_m + i_1^m)^2}{g^2} \frac{L^2 \sin(2\omega t)}{16\pi}.$$

$$T_{x2} = -\frac{W_m}{2\mu_0} \frac{N_m^2(+i_1^m)^2}{g^2} \frac{L^2 \sin(2\omega t)}{16\pi}.$$

$$T_{x3} = -\frac{W_m}{2\mu_0} \frac{N_m^2(I_m + i_1^m)^2}{g^2} \frac{L^2 \sin(2\omega t)}{16\pi}.$$

$$T_{x4} = -\frac{W_m}{2\mu_0} \frac{N_m^2(I_m + i_1^m)^2}{g^2} \frac{L^2 \sin(2\omega t)}{16\pi}$$

Figure 9:
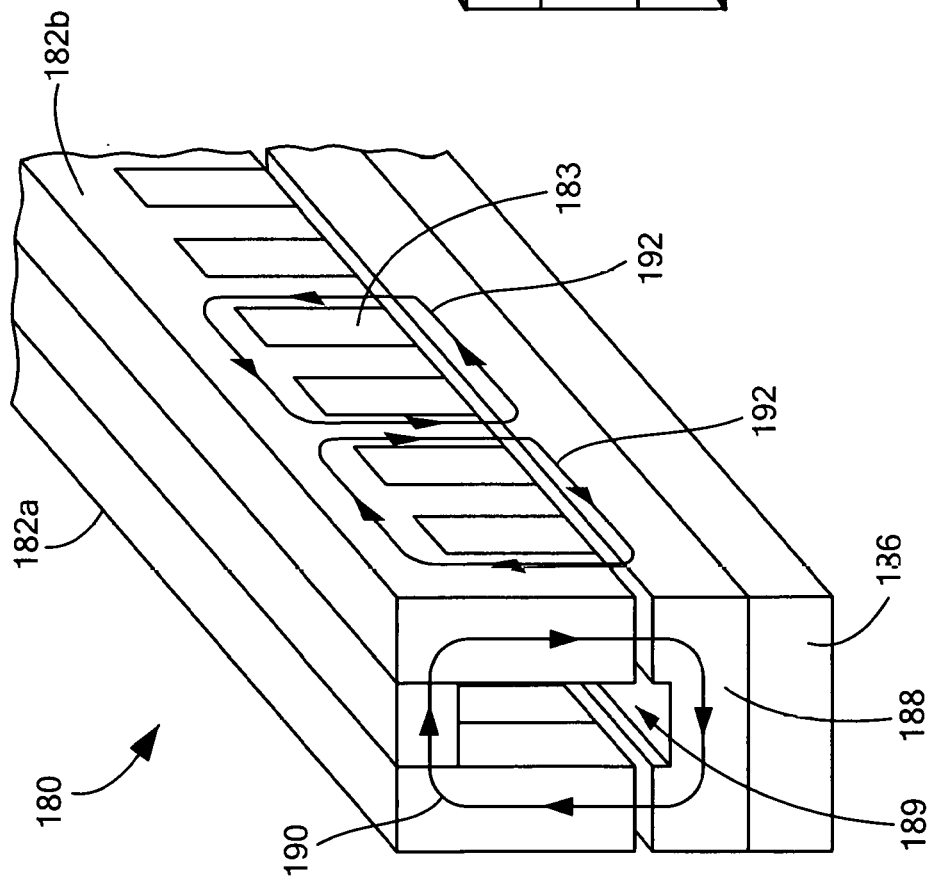
FIG. 9 is an isometric view of a portion of a motor stator.
Figure 9A:
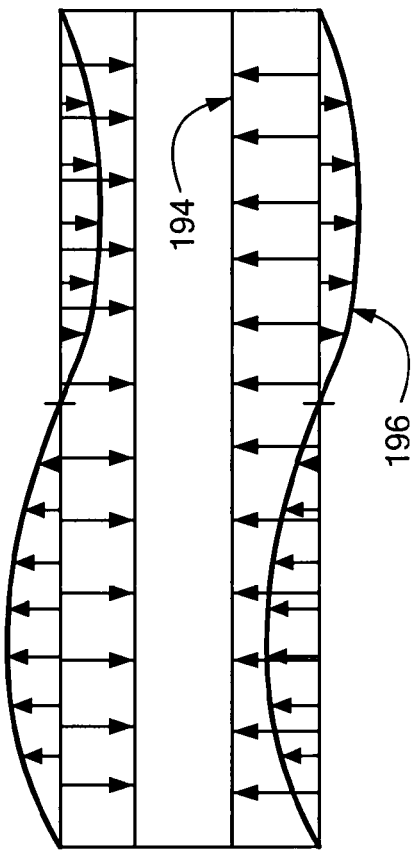
FIG. 9A is a plot of suspension bearing segment design and flux distribution for the motor segment of FIG. 9.

FIGS. 9 and 9A show the bearing segment magnetic flux distributional shows the magnetic airgap the air-gap field on the bearing segment are $$B_1^b = B_{pm} + N_s i_{Rx} \sin\left(\frac{2\pi}{L}y\right)\Big/g,$$

$$B_2^b = B_{pm} - N_s i_{Rx} \sin\left(\frac{2\pi}{L}y\right)\Big/g,$$

$$B_3^b = B_{pm} + N_s i_{Rx} \sin\left(\frac{2\pi}{L}y\right)\Big/g,$$

$$B_4^b = B_{pm} - N_s i_{Rx} \sin\left(\frac{2\pi}{L}y\right)\Big/g,$$

where $B_{pm}$ is the air gap flux generated by the permanent magnet bias, $N_s$ is the number of turns per phase per pole for the $\theta_x$ suspension winding, $i_{Rx}$ is the current amplitude of the $\theta_x$ suspension winding.

The normal force generation of the bearing section can be calculated as $$f_1^s = \int_{-L/2}^{L/2}\left(W_b \frac{B_1^{b2}}{2\mu_0}\right) dy$$

$$= \frac{W_b}{2\mu_0} \int_{-L/2}^{L/2}\left(B_{pm}^2 + 2 B_{pm} \frac{N_s i_s \sin(2\pi/L)}{g} + \frac{N_s^2 i_s^2 \sin^2(2\pi y/L)}{g^2}\right) dy$$

$$= \frac{W_b L}{2\mu_0}\left(B_{pm}^2 + \frac{N_s^2 i_{Rx}^2}{2g^2}\right).$$

The forces by the other bearing segments also equals $f_1^s$. The forces cancel each other during the stage is operating, and will not provide disturbance forces to the linear stage when the stage is centered.

The torque about x-axis generated by the bearing segment 1 is $$T_{x1}^e = \int_{-L/2}^{L/2} \left( w_n \frac{B_{b1}^2}{2\mu_0} \right) y \, dy$$

$$= \frac{W_b}{2\mu_0} \int_{-L/2}^{L/2} \left( B_{pm}^2 + 2B_{pm} \frac{N_s i_{Rx} \sin(2\pi/L)}{g} + \frac{N_s^2 i_{Rx}^2 \sin^2(2\pi y/L)}{g^2} \right) y \, dy$$

$$= \frac{W_b L^2 B_{pm}^2 N_s}{2\pi \mu_0 g} i_{Rx},$$

which is proportional to $i_{Rx}$. This torque is generated by the interaction between the bias magnetic flux and the flux generated in the windings. In this way the torque about x-axis can be actively controlled with the current amplitude $i_{Rx}$.

Described is an MLLS driven by linear HMs. Passive magnetic suspension is utilized to reduce actuators and sensors. Such a design may be utilized, for example, in a lithography system having a so-called separation wall (e.g. a wall made from titanium or other non-magnetic material) which separates a stator from a "motion portion" of the system. Thus, in such a system the stator and transportation stage may be disposed on opposite sides of such a separation wall where the stator side of the wall may be considered a "dirty vacuum and the transportation stage side of the wall may be considered a "clean vacuum."

All publications and references cited herein are expressly incorporated herein by reference in their entirety.

All publications and references cited herein are expressly incorporated herein by reference in their entirety.

What is claimed is:

1. A reticle transportation system comprising:
   a transportation stage having a base portion having first and second sides and first and second opposing surfaces, said base portion configured to hold a reticle on at least one of the first and second opposing surfaces, a first conveyor portion coupled to a first side of said base portion, said first conveyor portion configured to hold at least one bearing secondary and at least one motor secondary and a second conveyor portion coupled to a second, different side of said base portion, said second conveyor portion configured to hold at least one bearing secondary and at least one motor secondary;
   a first linear hysteresis motor coupled to said first conveyor portion and arranged so as to drive said transportation stage along an axis; and
   a second linear hysteresis motor coupled to said second conveyor portion and arranged so as to drive said transportation stage along an axis.

2. The reticle transportation system of claim 1 wherein each of said first and second linear hysteresis motors comprises:
   a stator; and
   at least one bearing secondary and at least one motor secondary disposed on a first surface of respective ones of said first and second conveyor portions of said transportation stage and configured so as to interact with a respective one of said stators of said first and second linear hysteresis motors.

3. The reticle transportation system of claim 1 further comprising:
   a first pair of hysteresis motor secondaries coupled to opposing surfaces of said first conveyor portion of said transportation stage;
   a second pair of hysteresis motor secondaries coupled to opposing surfaces of said second conveyor portion of said transportation stage; and
   a first pair of suspension secondaries coupled to opposing surfaces of said first conveyor portion of said transportation stage; and
   a second pair of suspension secondaries coupled to opposing surfaces of said second conveyor portion of said transportation stage.

4. The reticle transportation system of claim 3 wherein said transportation stage is provided as an integrated assembly including at least two components.

5. The reticle transportation system of claim 3 wherein said transportation stage is provided as a monolithic assembly.

6. The reticle transportation system of claim 1 wherein:
   the first linear hysteresis motor comprises a first thrust generation stator comprising a plurality of stator segments, windings arranged in each stator wherein the windings of each stator segment are separated such that currents in a coil on one stator segment are not connected in series or parallel with the coils on another stator segment and a first suspension stator having a permanent magnet capable of providing a permanent magnet bias flux; and
   the second linear hysteresis motor comprises a second thrust generation stator comprising a plurality of stator segments, windings arranged in each stator wherein the windings of each stator segment are separated such that currents in a coil on one stator segment are not connected in series or parallel with the coils on another stator segment and a second suspension stator having a permanent magnet capable of providing a permanent magnet bias flux.

7. The reticle transportation system of claim 6 wherein one of the permanent magnet of the first suspension stator and the permanent magnet of the second suspension stator has a magnetization vector in a cross-motion direction in a plane.

8. A transportation system comprising:
   (a) a magnetically levitated transportation stage capable of moving, said transportation stage having a base portion and first and second conveyor portions;
   (b) a first linear hysteresis motor magnetically coupled to a first one of the first and second conveyor portions of said transportation stage, said first linear hysteresis motor comprising:
      (b1) a first pair of hysteresis motor secondaries coupled to opposing surfaces of the first conveyor portion of said transportation stage; and
      (b2) a first pair of suspension secondaries coupled to opposing surfaces of said first conveyor portion of said transportation stage;
   (c) a second linear hysteresis motor magnetically coupled to a second one of the first and second conveyor portions of said transportation stage, said first linear hysteresis motor comprising:
      (c1) a second pair of hysteresis motor secondaries coupled to opposing surfaces of said second conveyor portion of said transportation stage; and (c2) a second pair of suspension secondaries coupled to opposing surfaces of said second conveyor portion of said transportation stage.

9. The transportation system of clam 8 further comprising means for providing passive magnetic suspension, said means for providing passive magnetic suspension coupled to transportation stage.

\* \* \* \* \*